(12) United States Patent
Fachan et al.

(10) Patent No.: US 11,722,150 B1
(45) Date of Patent: Aug. 8, 2023

(54) ERROR RESISTANT WRITE-AHEAD LOG

(71) Applicant: Qumulo, Inc., Seattle, WA (US)

(72) Inventors: Neal Thomas Fachan, Seattle, WA (US); Stephen Craig Fleischman, Seattle, WA (US); Conner Saltiel Hansen, Portland, OR (US); David Patrick Rogers, III, Seattle, WA (US); Thomas Gregory Rothschilds, Seattle, WA (US); Hanqing Zhang, Seattle, WA (US)

(73) Assignee: Qumulo, Inc., Seattle, WA (US)

( * ) Notice: Subject to any disclaimer, the term of this patent is extended or adjusted under 35 U.S.C. 154(b) by 0 days.

(21) Appl. No.: 17/954,640

(22) Filed: Sep. 28, 2022

(51) Int. Cl.
*H03M 13/09* (2006.01)
*G06F 16/11* (2019.01)
*H03M 13/00* (2006.01)

(52) U.S. Cl.
CPC ........ *H03M 13/091* (2013.01); *G06F 16/122* (2019.01); *H03M 13/611* (2013.01)

(58) Field of Classification Search
CPC .. H03M 13/091; H03M 13/611; G06F 16/122
See application file for complete search history.

(56) References Cited

U.S. PATENT DOCUMENTS

| | | | |
|---|---|---|---|
| 5,165,031 A | 11/1992 | Pruul et al. | |
| 5,283,875 A | 2/1994 | Gibson et al. | |
| 5,319,773 A | 6/1994 | Britton et al. | |
| 5,410,684 A | 4/1995 | Ainsworth et al. | |
| 5,410,719 A | 4/1995 | Shackleford | |
| 5,442,561 A | 8/1995 | Yoshizawa et al. | |
| 5,953,719 A | 9/1999 | Kleewein et al. | |
| 6,236,996 B1 | 5/2001 | Bapat et al. | |

(Continued)

FOREIGN PATENT DOCUMENTS

| | | |
|---|---|---|
| EP | 1217551 A2 | 6/2002 |
| EP | 1498829 A1 | 1/2005 |

(Continued)

OTHER PUBLICATIONS

Office Communication for U.S. Appl. No. 16/226,587 dated Aug. 5, 2019, pp. 1-46.

(Continued)

*Primary Examiner* — Thien Nguyen
(74) *Attorney, Agent, or Firm* — John W. Branch; Branch Partners PLLC

(57) ABSTRACT

Embodiments are directed to error resistant logging. A write-ahead log (WAL) for preserving a verifiable record of file system activity may be provided such that the WAL may include a sequence of log blocks that each may include a cyclic redundancy check (CRC) value of a next adjacent log block in the WAL. In response to executing a file system operation associated with payload data, further actions may be performed, including: generating log blocks based on the payload data; generating a log segment that includes the log blocks; modifying a portion of the contents of a head-block of the log segment such that the modified head-block of the log segment has a CRC value that matches a CRC value of a tail-block of the WAL; copying the contents of the modified head-block of the log segment into the tail-block of the WAL.

20 Claims, 15 Drawing Sheets

(56) References Cited

U.S. PATENT DOCUMENTS

| | | |
|---|---|---|
| 6,385,641 B1 | 5/2002 | Jiang et al. |
| 6,415,283 B1 | 7/2002 | Conklin |
| 6,496,944 B1 | 12/2002 | Hsiao et al. |
| 6,529,998 B1 | 3/2003 | Yochai et al. |
| 6,560,615 B1 | 5/2003 | Zayas et al. |
| 6,772,435 B1 | 8/2004 | Thexton et al. |
| 6,874,130 B1 | 3/2005 | Baweja et al. |
| 6,892,211 B2 | 5/2005 | Hitz et al. |
| 6,965,903 B1 | 11/2005 | Agarwal et al. |
| 6,965,936 B1 | 11/2005 | Wipfel et al. |
| 7,165,158 B1 | 1/2007 | Yagawa |
| 7,213,040 B1 | 5/2007 | Stokes et al. |
| 7,330,948 B2 | 2/2008 | Deguchi et al. |
| 7,467,333 B2 | 12/2008 | Keeton et al. |
| 7,594,138 B2 | 9/2009 | Abdulvahid |
| 7,636,743 B2 | 12/2009 | Erofeev |
| 7,693,876 B2 | 4/2010 | Hackworth et al. |
| 7,757,056 B1 | 7/2010 | Fair |
| 7,761,456 B1 | 7/2010 | Cram et al. |
| 7,844,580 B2 | 11/2010 | Srivastava et al. |
| 7,933,870 B1 | 4/2011 | Webster |
| 7,937,421 B2 | 5/2011 | Mikesell et al. |
| 7,958,304 B1 | 6/2011 | Goel et al. |
| 7,962,709 B2 | 6/2011 | Agrawal |
| 7,966,293 B1 | 6/2011 | Owara et al. |
| 8,027,827 B2 | 9/2011 | Bitar et al. |
| 8,046,378 B1 | 10/2011 | Zhuge et al. |
| 8,108,429 B2 | 1/2012 | Sim-Tang et al. |
| 8,296,312 B1 | 10/2012 | Leung et al. |
| 8,341,540 B1 | 12/2012 | Haynes et al. |
| 8,355,407 B2 | 1/2013 | Wookey et al. |
| 8,364,648 B1 | 1/2013 | Sim-Tang |
| 8,423,733 B1 | 4/2013 | Ozdemir |
| 8,423,821 B1 | 4/2013 | Keith, Jr. |
| 8,448,170 B2 | 5/2013 | Wipfel et al. |
| 8,463,825 B1 | 6/2013 | Harty et al. |
| 8,489,656 B2 | 7/2013 | Erofeev |
| 8,504,733 B1 | 8/2013 | Tyer et al. |
| 8,515,911 B1 | 8/2013 | Zhou et al. |
| 8,612,404 B2 | 12/2013 | Bone et al. |
| 8,612,488 B1 | 12/2013 | Subramanya et al. |
| 8,645,323 B2 | 2/2014 | Jackiewicz et al. |
| 8,661,447 B1 | 2/2014 | Olliff et al. |
| 8,725,691 B1 | 5/2014 | Natanzon |
| 8,776,050 B2 | 7/2014 | Plouffe et al. |
| 8,782,655 B2 | 7/2014 | Blanding et al. |
| 8,806,154 B1 | 8/2014 | Gupta et al. |
| 8,838,887 B1 | 9/2014 | Burke et al. |
| 8,838,931 B1 | 9/2014 | Marshak et al. |
| 8,849,764 B1 | 9/2014 | Long et al. |
| 8,849,809 B1 | 9/2014 | Seshadri |
| 8,868,797 B1 | 10/2014 | Kirac et al. |
| 8,924,364 B1 | 12/2014 | Zhong et al. |
| 8,972,694 B1 | 3/2015 | Dolan et al. |
| 9,015,214 B2 | 4/2015 | Nishida et al. |
| 9,026,765 B1 | 5/2015 | Marshak et al. |
| 9,031,994 B1 | 5/2015 | Cao et al. |
| 9,032,170 B2 | 5/2015 | Vaghani et al. |
| 9,047,017 B1 | 6/2015 | Dolan et al. |
| 9,141,633 B1 | 9/2015 | Li et al. |
| 9,143,379 B1 | 9/2015 | Berger et al. |
| 9,158,653 B2 | 10/2015 | Gold |
| 9,171,145 B2 | 10/2015 | Dash et al. |
| 9,244,975 B2 | 1/2016 | Das et al. |
| 9,244,976 B1 | 1/2016 | Zhang et al. |
| 9,361,187 B2 | 6/2016 | Jarvis |
| 9,384,252 B2 | 7/2016 | Akirav et al. |
| 9,459,804 B1 | 10/2016 | Natanzon et al. |
| 9,501,487 B1 | 11/2016 | Yuan et al. |
| 9,547,560 B1 | 1/2017 | Lee |
| 9,600,193 B2 | 3/2017 | Ahrens et al. |
| 9,727,432 B1 | 8/2017 | Cutforth et al. |
| 9,747,171 B2 | 8/2017 | Beeken et al. |
| 9,753,782 B2 | 9/2017 | Fang et al. |
| 9,753,932 B1 | 9/2017 | Brow et al. |
| 9,753,987 B1 | 9/2017 | Dolan et al. |
| 9,785,377 B2 | 10/2017 | Shin et al. |
| 9,846,698 B1 | 12/2017 | Panidis et al. |
| 10,140,185 B1 | 11/2018 | Lopez et al. |
| 10,261,868 B2 | 4/2019 | Brown et al. |
| 10,275,493 B1 | 4/2019 | Mostak |
| 10,303,561 B2 | 5/2019 | Beeken et al. |
| 10,318,401 B2 | 6/2019 | Rothschilds et al. |
| 10,339,101 B1 | 7/2019 | Gupta |
| 10,423,609 B1 | 9/2019 | Strauss |
| 10,437,509 B1 | 10/2019 | Alexeev et al. |
| 10,447,779 B2 | 10/2019 | Dieterich et al. |
| 10,474,635 B1 | 11/2019 | Unger et al. |
| 10,534,758 B1 | 1/2020 | Carpenter et al. |
| 10,540,662 B2 | 1/2020 | Barlett et al. |
| 10,545,986 B2 | 1/2020 | Tappan et al. |
| 10,621,057 B2 | 4/2020 | Tripathi et al. |
| 10,621,147 B1 | 4/2020 | Liang et al. |
| 10,664,408 B1 | 5/2020 | Chatterjee et al. |
| 10,678,663 B1 | 6/2020 | Sharma et al. |
| 10,725,977 B1 | 7/2020 | Chmiel et al. |
| 10,795,796 B1 | 10/2020 | Bai et al. |
| 10,860,546 B2 | 12/2020 | Ye et al. |
| 11,023,535 B1 | 6/2021 | Greenwood et al. |
| 11,150,823 B2 | 10/2021 | Gao et al. |
| 11,157,458 B1 | 10/2021 | Carter et al. |
| 11,265,262 B1 | 3/2022 | Makie et al. |
| 2001/0039622 A1 | 11/2001 | Hitz et al. |
| 2002/0059439 A1 | 5/2002 | Arroyo et al. |
| 2002/0065835 A1 | 5/2002 | Fujisaki |
| 2002/0083073 A1 | 6/2002 | Vaidya et al. |
| 2002/0099691 A1 | 7/2002 | Lore et al. |
| 2002/0178271 A1 | 11/2002 | Graham et al. |
| 2003/0033308 A1 | 2/2003 | Patel et al. |
| 2003/0145009 A1 | 7/2003 | Forman et al. |
| 2003/0177379 A1 | 9/2003 | Hori et al. |
| 2003/0182313 A1 | 9/2003 | Federwisch et al. |
| 2004/0030727 A1 | 2/2004 | Armangau et al. |
| 2004/0093474 A1 | 5/2004 | Lin et al. |
| 2004/0098425 A1 | 5/2004 | Wiss et al. |
| 2004/0153479 A1 | 8/2004 | Mikesell et al. |
| 2004/0255048 A1 | 12/2004 | Lev Ran et al. |
| 2005/0015674 A1 | 1/2005 | Haugh |
| 2005/0027748 A1 | 2/2005 | Kisley |
| 2005/0065986 A1 | 3/2005 | Bixby et al. |
| 2005/0091663 A1 | 4/2005 | Bagsby |
| 2005/0114593 A1 | 5/2005 | Cassell et al. |
| 2005/0114726 A1 | 5/2005 | Ouchi |
| 2005/0119996 A1 | 6/2005 | Ohata et al. |
| 2005/0154866 A1 | 7/2005 | Steely, Jr. et al. |
| 2005/0182992 A1 | 8/2005 | Land et al. |
| 2005/0195660 A1 | 9/2005 | Kavuri et al. |
| 2005/0223019 A1 | 10/2005 | Das et al. |
| 2006/0004890 A1 | 1/2006 | Semple et al. |
| 2006/0053139 A1 | 3/2006 | Marzinski et al. |
| 2006/0089982 A1 | 4/2006 | Abbott et al. |
| 2006/0090036 A1 | 4/2006 | Zohar et al. |
| 2006/0123005 A1 | 6/2006 | Burnett et al. |
| 2006/0173842 A1 | 8/2006 | Horvitz et al. |
| 2006/0271604 A1 | 11/2006 | Shoens |
| 2007/0011302 A1 | 1/2007 | Groner et al. |
| 2007/0027985 A1 | 2/2007 | Ramany et al. |
| 2007/0100855 A1 | 5/2007 | T. Kohl |
| 2007/0106706 A1 | 5/2007 | Ahrens et al. |
| 2007/0118561 A1 | 5/2007 | Idicula et al. |
| 2007/0143371 A1 | 6/2007 | Kottomtharayil |
| 2008/0028006 A1 | 1/2008 | Liu et al. |
| 2008/0059399 A1 | 3/2008 | DeLorme et al. |
| 2008/0059541 A1 | 3/2008 | Fachan et al. |
| 2008/0082593 A1 | 4/2008 | Komarov et al. |
| 2008/0162608 A1 | 7/2008 | Torii et al. |
| 2008/0172366 A1 | 7/2008 | Hannel et al. |
| 2008/0228772 A1 | 9/2008 | Plamondon |
| 2008/0250357 A1 | 10/2008 | Lee et al. |
| 2008/0256474 A1 | 10/2008 | Chakra et al. |
| 2008/0270469 A1 | 10/2008 | Myerson et al. |
| 2008/0270928 A1 | 10/2008 | Chakra et al. |
| 2008/0282244 A1 | 11/2008 | Wu et al. |
| 2008/0288306 A1 | 11/2008 | MacIntyre et al. |

(56) References Cited

U.S. PATENT DOCUMENTS

| | | |
|---|---|---|
| 2008/0301256 A1 | 12/2008 | McWilliams et al. |
| 2008/0313217 A1 | 12/2008 | Dunsmore et al. |
| 2009/0077087 A1 | 3/2009 | Urano et al. |
| 2009/0138500 A1 | 5/2009 | Yuan et al. |
| 2009/0199190 A1 | 8/2009 | Chen et al. |
| 2009/0222509 A1 | 9/2009 | King et al. |
| 2009/0240539 A1 | 9/2009 | Slawson et al. |
| 2009/0274047 A1 | 11/2009 | Kruys et al. |
| 2009/0319566 A1 | 12/2009 | Wald et al. |
| 2009/0327642 A1 | 12/2009 | Ogihara et al. |
| 2010/0030825 A1 | 2/2010 | Matsuzawa et al. |
| 2010/0036895 A1 | 2/2010 | Boyd et al. |
| 2010/0088317 A1 | 4/2010 | Bone et al. |
| 2010/0161557 A1 | 6/2010 | Anderson et al. |
| 2010/0179959 A1 | 7/2010 | Shoens |
| 2010/0217948 A1 | 8/2010 | Mason et al. |
| 2010/0241668 A1 | 9/2010 | Susanto et al. |
| 2010/0281214 A1 | 11/2010 | Jernigan, IV |
| 2010/0287512 A1 | 11/2010 | Gan et al. |
| 2011/0039622 A1 | 2/2011 | Levenson |
| 2011/0066668 A1 | 3/2011 | Guarraci |
| 2011/0082836 A1 | 4/2011 | Wang et al. |
| 2011/0125799 A1 | 5/2011 | Kandasamy et al. |
| 2011/0125973 A1 | 5/2011 | Lev et al. |
| 2011/0161381 A1 | 6/2011 | Wang et al. |
| 2011/0161964 A1 | 6/2011 | Piazza et al. |
| 2011/0196833 A1 | 8/2011 | Drobychev et al. |
| 2011/0196899 A1 | 8/2011 | Hughes et al. |
| 2011/0202925 A1 | 8/2011 | Banerjee et al. |
| 2011/0246724 A1 | 10/2011 | Marathe et al. |
| 2012/0036463 A1 | 2/2012 | Krakovsky et al. |
| 2012/0066179 A1 | 3/2012 | Saika |
| 2012/0096059 A1 | 4/2012 | Shimizu et al. |
| 2012/0136843 A1 | 5/2012 | Bone et al. |
| 2012/0151438 A1 | 6/2012 | Bach et al. |
| 2012/0166478 A1 | 6/2012 | Das et al. |
| 2012/0179886 A1 | 7/2012 | Prahlad et al. |
| 2012/0204060 A1 | 8/2012 | Swift et al. |
| 2012/0216005 A1 | 8/2012 | Naito et al. |
| 2012/0317079 A1 | 12/2012 | Shoens et al. |
| 2013/0019072 A1 | 1/2013 | Strasser et al. |
| 2013/0024609 A1 | 1/2013 | Gorobets et al. |
| 2013/0073819 A1 | 3/2013 | Havewala et al. |
| 2013/0086121 A1 | 4/2013 | Preslan |
| 2013/0091168 A1 | 4/2013 | Bhave et al. |
| 2013/0110787 A1 | 5/2013 | Garimella et al. |
| 2013/0191355 A1 | 7/2013 | Bone et al. |
| 2013/0212579 A1 | 8/2013 | Ben-Shaul et al. |
| 2013/0227236 A1 | 8/2013 | Flynn et al. |
| 2013/0254163 A1 | 9/2013 | Savage et al. |
| 2013/0268650 A1 | 10/2013 | Faitelson et al. |
| 2013/0275391 A1 | 10/2013 | Batwara et al. |
| 2013/0304903 A1 | 11/2013 | Mick et al. |
| 2013/0311454 A1 | 11/2013 | Ezzat |
| 2013/0318194 A1 | 11/2013 | Timbs |
| 2013/0325806 A1 | 12/2013 | Bachar et al. |
| 2013/0325808 A1 | 12/2013 | Bachar et al. |
| 2013/0339406 A1 | 12/2013 | Kanfi |
| 2014/0006354 A1 | 1/2014 | Parkinson et al. |
| 2014/0040199 A1 | 2/2014 | Golab et al. |
| 2014/0040693 A1 | 2/2014 | Kim et al. |
| 2014/0059158 A1 | 2/2014 | Chen et al. |
| 2014/0089278 A1 | 3/2014 | Lovinger et al. |
| 2014/0089649 A1 | 3/2014 | Chaganti |
| 2014/0095249 A1 | 4/2014 | Tarakad et al. |
| 2014/0095505 A1 | 4/2014 | Blanchflower et al. |
| 2014/0095560 A1 | 4/2014 | Ikai et al. |
| 2014/0095582 A1 | 4/2014 | Eshel et al. |
| 2014/0101389 A1 | 4/2014 | Nellans et al. |
| 2014/0156956 A1 | 6/2014 | Ezra |
| 2014/0181441 A1 | 6/2014 | Kottomtharayil et al. |
| 2014/0189267 A1 | 7/2014 | Qi et al. |
| 2014/0195847 A1 | 7/2014 | Webman et al. |
| 2014/0237193 A1 | 8/2014 | Shivashankaraiah |
| 2014/0258609 A1 | 9/2014 | Cui et al. |
| 2014/0280485 A1 | 9/2014 | A Hummaida et al. |
| 2014/0281307 A1 | 9/2014 | Peterson et al. |
| 2014/0281411 A1 | 9/2014 | Abdallah |
| 2014/0344222 A1 | 11/2014 | Morris et al. |
| 2014/0372384 A1 | 12/2014 | Long et al. |
| 2014/0372607 A1 | 12/2014 | Gladwin et al. |
| 2014/0373032 A1 | 12/2014 | Merry et al. |
| 2015/0006226 A1 | 1/2015 | Smith et al. |
| 2015/0012666 A1 | 1/2015 | Pannese et al. |
| 2015/0067086 A1 | 3/2015 | Adriaens et al. |
| 2015/0067142 A1 | 3/2015 | Renkema |
| 2015/0106145 A1 | 4/2015 | Hamilton et al. |
| 2015/0135331 A1 | 5/2015 | Das |
| 2015/0143026 A1 | 5/2015 | Reddy et al. |
| 2015/0149736 A1 | 5/2015 | Kwon et al. |
| 2015/0186217 A1 | 7/2015 | Eslami Sarab |
| 2015/0186410 A1 | 7/2015 | Petculescu et al. |
| 2015/0186483 A1 | 7/2015 | Tappan et al. |
| 2015/0186527 A1 | 7/2015 | Rao et al. |
| 2015/0186529 A1 | 7/2015 | Rope et al. |
| 2015/0193347 A1 | 7/2015 | Kluesing et al. |
| 2015/0215405 A1 | 7/2015 | Baek et al. |
| 2015/0234716 A1 | 8/2015 | Brooker et al. |
| 2015/0234879 A1 | 8/2015 | Baldwin et al. |
| 2015/0242263 A1 | 8/2015 | Klose |
| 2015/0248253 A1 | 9/2015 | Kim et al. |
| 2015/0278282 A1 | 10/2015 | Sardina et al. |
| 2015/0310035 A1 | 10/2015 | Godman et al. |
| 2015/0347126 A1 | 12/2015 | Tibble et al. |
| 2016/0034356 A1 | 2/2016 | Aron et al. |
| 2016/0110105 A1 | 4/2016 | Karamcheti et al. |
| 2016/0139836 A1 | 5/2016 | Nallathambi et al. |
| 2016/0147654 A1 | 5/2016 | Zhao et al. |
| 2016/0224430 A1 | 8/2016 | Long et al. |
| 2016/0239185 A1 | 8/2016 | Balimidi et al. |
| 2016/0246816 A1 | 8/2016 | Abiri et al. |
| 2016/0269501 A1 | 9/2016 | Usgaonkar et al. |
| 2016/0292013 A1 | 10/2016 | Li et al. |
| 2016/0292429 A1 | 10/2016 | Manville et al. |
| 2016/0306810 A1 | 10/2016 | Ni et al. |
| 2016/0314046 A1 | 10/2016 | Kumarasamy |
| 2016/0335278 A1 | 11/2016 | Tabaaloute et al. |
| 2016/0357677 A1 | 12/2016 | Hooker et al. |
| 2016/0359859 A1 | 12/2016 | Capone |
| 2016/0371297 A1 | 12/2016 | Okun et al. |
| 2016/0380878 A1 | 12/2016 | Bugenhagen et al. |
| 2017/0024152 A1 | 1/2017 | Bhagi et al. |
| 2017/0032006 A1 | 2/2017 | Anglin et al. |
| 2017/0046143 A1 | 2/2017 | Kochhar et al. |
| 2017/0052898 A1 | 2/2017 | Ash et al. |
| 2017/0078164 A1 | 3/2017 | Hildebrand et al. |
| 2017/0091046 A1 | 3/2017 | Bangalore et al. |
| 2017/0118287 A1 | 4/2017 | Beck |
| 2017/0123883 A1 | 5/2017 | Hall |
| 2017/0123935 A1 | 5/2017 | Pandit et al. |
| 2017/0163728 A1 | 6/2017 | Chawla et al. |
| 2017/0201582 A1 | 7/2017 | Zhang et al. |
| 2017/0206231 A1 | 7/2017 | Binder et al. |
| 2017/0270180 A1 | 9/2017 | State |
| 2017/0286455 A1 | 10/2017 | Li et al. |
| 2017/0316321 A1 | 11/2017 | Whitney et al. |
| 2017/0336983 A1 | 11/2017 | Roh et al. |
| 2017/0344598 A1 | 11/2017 | Constantinescu et al. |
| 2017/0344905 A1 | 11/2017 | Hack et al. |
| 2017/0366609 A1 | 12/2017 | Dieterich et al. |
| 2018/0040029 A1 | 2/2018 | Zeng et al. |
| 2018/0059946 A1 | 3/2018 | Kunii et al. |
| 2018/0089031 A1 | 3/2018 | Mitkar et al. |
| 2018/0101546 A1 | 4/2018 | Krasnow et al. |
| 2018/0129443 A1 | 5/2018 | Karve et al. |
| 2018/0203798 A1 | 7/2018 | Hughes et al. |
| 2018/0276078 A1 | 9/2018 | Blea et al. |
| 2018/0288057 A1 | 10/2018 | Varadamma et al. |
| 2018/0314423 A1 | 11/2018 | Gong et al. |
| 2018/0365115 A1 | 12/2018 | Fang et al. |
| 2019/0087770 A1 | 3/2019 | Walsh et al. |
| 2019/0095112 A1 | 3/2019 | Lingarajappa |
| 2019/0102700 A1 | 4/2019 | Babu et al. |
| 2019/0163589 A1 | 5/2019 | McBride et al. |

(56) References Cited

U.S. PATENT DOCUMENTS

| | | | |
|---|---|---|---|
| 2019/0163591 A1 | 5/2019 | Ouyang et al. | |
| 2019/0196879 A1 | 6/2019 | Dutta et al. | |
| 2019/0212921 A1 | 7/2019 | Liang et al. | |
| 2019/0220189 A1 | 7/2019 | Yang et al. | |
| 2019/0286521 A1 | 9/2019 | Okpotse et al. | |
| 2019/0286528 A1 | 9/2019 | Wu et al. | |
| 2019/0384640 A1 | 12/2019 | Swamy et al. | |
| 2020/0004977 A1 | 1/2020 | Araujo et al. | |
| 2020/0026438 A1 | 1/2020 | Peleg et al. | |
| 2020/0034077 A1 | 1/2020 | Haravu et al. | |
| 2020/0050391 A1 | 2/2020 | Meyerowitz et al. | |
| 2020/0142878 A1 | 5/2020 | Varadarajan et al. | |
| 2020/0174692 A1 | 6/2020 | Dave et al. | |
| 2020/0242075 A1 | 7/2020 | Davis et al. | |
| 2020/0286270 A1 | 9/2020 | Lymperopoulos et al. | |
| 2020/0341689 A1 | 10/2020 | Smith | |
| 2020/0387315 A1* | 12/2020 | Sterns | G06F 3/0683 |
| 2020/0409583 A1 | 12/2020 | Kusters et al. | |
| 2021/0004355 A1 | 1/2021 | Iwase | |
| 2021/0042263 A1 | 2/2021 | Zdornov et al. | |
| 2021/0042282 A1 | 2/2021 | Cseri et al. | |
| 2021/0056074 A1 | 2/2021 | Zhu | |
| 2021/0110150 A1 | 4/2021 | Kakrana et al. | |
| 2021/0191650 A1 | 6/2021 | Vansteenkiste et al. | |
| 2021/0240393 A1 | 8/2021 | Jo et al. | |
| 2021/0240678 A1 | 8/2021 | Patel et al. | |
| 2021/0279187 A1 | 9/2021 | Puder et al. | |
| 2021/0311841 A1 | 10/2021 | McNutt | |
| 2021/0374105 A1 | 12/2021 | Kodama et al. | |
| 2022/0019361 A1 | 1/2022 | Kurata et al. | |
| 2022/0035831 A1 | 2/2022 | Beers | |
| 2022/0066882 A1 | 3/2022 | Wang et al. | |
| 2022/0091739 A1 | 3/2022 | Kumar et al. | |
| 2022/0107729 A1 | 4/2022 | Hua | |

FOREIGN PATENT DOCUMENTS

| | | | |
|---|---|---|---|
| WO | 1999044145 A1 | 9/1999 | |
| WO | 0072201 A1 | 11/2000 | |
| WO | 2009007250 A2 | 1/2009 | |
| WO | 2012029259 A1 | 3/2012 | |

OTHER PUBLICATIONS

Office Communication for U.S. Appl. No. 16/228,716 dated Jun. 24, 2019, pp. 1-10.
Office Communication for U.S. Appl. No. 16/231,354 dated Jul. 10, 2019, pp. 1-8.
Office Communication for U.S. Appl. No. 16/262,756 dated Aug. 5, 2019, pp. 1-35.
Office Communication for U.S. Appl. No. 15/967,499 dated Jun. 27, 2018, pp. 1-16.
Office Communication for U.S. Appl. No. 16/226,587 dated Feb. 25, 2019, pp. 1-43.
Office Communication for U.S. Appl. No. 16/228,716 dated Feb. 28, 2019, pp. 1-15.
Office Communication for U.S. Appl. No. 16/231,354 dated Mar. 25, 2019, pp. 1-10.
Office Communication for U.S. Appl. No. 16/262,756 dated Apr. 2, 2019, pp. 1-29.
Office Communication for U.S. Appl. No. 16/262,790 dated Aug. 23, 2019, pp. 1-16.
Office Communication for U.S. Appl. No. 16/262,790 dated Apr. 18, 2019, pp. 1-14.
Office Communication for U.S. Appl. No. 16/262,756 dated Oct. 25, 2019, pp. 1-4.
Office Communication for U.S. Appl. No. 16/659,488 dated Dec. 30, 2019, pp. 1-6.
Office Communication for U.S. Appl. No. 14/595,598 dated Dec. 31, 2019, pp. 1-16.
Office Communication for U.S. Appl. No. 16/004,208 dated Aug. 27, 2018, pp. 1-11.
Office Communication for U.S. Appl. No. 16/234,395 dated Aug. 8, 2019, pp. 1-10.
Office Communication for U.S. Appl. No. 16/234,334 dated Apr. 5, 2019, pp. 1-15.
Office Communication for U.S. Appl. No. 16/234,395 dated Mar. 28, 2019, pp. 1-10.
Kappes, Giorgos et al., "Dike: Virtualization-aware Access Control for Multitenant Filesystems", Feb. 18, 2013, pp. 1-6.
Hitz, Dave et al., "Merging NT and UNIX filesystem Permissions", Proceedings of the 2nd USENIX Windows NT Symposium, Seattle, Washington, Aug. 3-4, 1998, pp. 1-10.
Office Communication for U.S. Appl. No. 16/234,334 dated Oct. 11, 2019, pp. 1-16.
Office Communication for U.S. Appl. No. 15/473,051 dated Jun. 30, 2017, pp. 1-23.
Extended European Search Report for European Patent Application No. 18155779.4 dated Apr. 17, 2018, pp. 1-15.
Office Communication for U.S. Appl. No. 16/004,182 dated Aug. 23, 2018, pp. 1-43.
Office Communication for U.S. Appl. No. 16/004,182 dated Mar. 5, 2019, pp. 1-46.
Office Communication for U.S. Appl. No. 16/004,182 dated Jul. 3, 2019, pp. 1-45.
Office Communication for U.S. Appl. No. 15/694,604 dated Jun. 3, 2019, pp. 1-8.
Office Communication for U.S. Appl. No. 16/004,182 dated May 22, 2019, pp. 1-4.
Office Communication for U.S. Appl. No. 14/595,043 dated May 4, 2017, pp. 1-30.
Office Communication for U.S. Appl. No. 14/595,043 dated Feb. 23, 2018, pp. 1-16.
Office Communication for U.S. Appl. No. 14/595,043 dated May 25, 2018, pp. 1-7.
Office Communication for U.S. Appl. No. 14/595,043 dated Oct. 5, 2018, pp. 1-17.
Office Communication for U.S. Appl. No. 14/595,043 dated Jun. 7, 2019, pp. 1-19.
Office Communication for U.S. Appl. No. 14/595,043 dated Aug. 27, 2019, pp. 1-17.
Office Communication for U.S. Appl. No. 14/658,015 dated Apr. 27, 2017, pp. 1-7.
Office Communication for U.S. Appl. No. 14/658,015 dated Jan. 4, 2018, pp. 1-28.
Office Communication for U.S. Appl. No. 14/658,015 datedd Jul. 13, 2018, pp. 1-8.
Office Communication for U.S. Appl. No. 14/859,061 dated Sep. 22, 2017, pp. 1-16.
Office Communication for U.S. Appl. No. 15/831,236 dated Mar. 30, 2018, pp. 1-8.
Office Communication for U.S. Appl. No. 15/831,236 dated Aug. 15, 2018, pp. 1-14.
Office Communication for U.S. Appl. No. 14/859,114 dated Jul. 24, 2017, pp. 1-41.
Office Communication for U.S. Appl. No. 14/859,114 dated Feb. 21, 2018, pp. 1-25.
Office Communication for U.S. Appl. No. 14/859,114 dated May 11, 2018, pp. 1-5.
Office Communication for U.S. Appl. No. 14/859,114 dated Jun. 27, 2018, pp. 1-33.
Office Communication for U.S. Appl. No. 14/859,114 dated Nov. 19, 2018, pp. 1-35.
Office Communication for U.S. Appl. No. 14/859,114 dated Jan. 31, 2019, pp. 1-4.
Office Communication for U.S. Appl. No. 14/859,114 dated Mar. 7, 2019, pp. 1-32.
Office Communication for U.S. Appl. No. 14/859,114 dated Jun. 26, 2019, pp. 1-21.
Office Communication for U.S. Appl. No. 14/859,114 dated Sep. 13, 2019, pp. 1-6.
Office Communication for U.S. Appl. No. 14/859,114 dated Nov. 26, 2019, pp. 1-21.
Office Communication for U.S. Appl. No. 15/288,853 dated Sep. 19, 2018, pp. 1-13.

(56) References Cited

OTHER PUBLICATIONS

Chimera, Richard, "Value Bars: An Information Visualization and Navigation Tool for Multi-attribute Listings", CHI '92, Monterey, CA, May 3-7, 1992, pp. 293-294.
Office Communication for U.S. Appl. No. 15/288,853 dated Mar. 25, 2019, pp. 1-10.
Cudre-Mauroux, Philippe et al., "TrajStore: An Adaptive Storage System for Very Large Trajectory Sets", ICDE 2010, Long Beach, CA, Mar. 1-6, 2010, pp. 109-120.
Office Communication for U.S. Appl. No. 16/436,825 dated Jul. 11, 2019, pp. 1-9.
Office Communication for U.S. Appl. No. 15/474,047 dated Sep. 18, 2017, pp. 1-14.
Office Communication for U.S. Appl. No. 15/474,047 dated Mar. 9, 2018, pp. 1-8.
Office Communication for U.S. Appl. No. 15/474,047 dated Jun. 11, 2018, pp. 1-6.
Office Communication for U.S. Appl. No. 15/474,047 dated Aug. 15, 2018, pp. 1-11.
Office Communication for U.S. Appl. No. 15/957,809 dated Jun. 28, 2018, pp. 1-27.
Office Communication for U.S. Appl. No. 15/957,809 dated Jan. 24, 2019, pp. 1-11.
Office Communication for U.S. Appl. No. 16/434,157 dated Jul. 25, 2019, pp. 1-8.
Office Communication for U.S. Appl. No. 15/854,447 dated May 6, 2019, pp. 1-9.
Office Communication for U.S. Appl. No. 16/505,562 dated Aug. 30, 2019, pp. 1-11.
Extended European Search Report for European Patent Application No. 17206518.7 dated Apr. 5, 2018, pp. 1-8.
Karatza et al., "Epoch Load Sharing in a Network of Workstations," Simulation Symposium, 2001. Proceedings. 34th Annual Apr. 22-26, 2001, Piscataway, NJ, USA, IEEE, XP010541274, ISBN: 978-0-7695-1092-7, pp. 36-42.
Office Communication for U.S. Appl. No. 16/004,182 dated Jan. 7, 2020, pp. 1-46.
Office Communication for U.S. Appl. No. 16/125,573 dated Nov. 21, 2019, pp. 1-13.
Office Communication for U.S. Appl. No. 16/226,587 dated Oct. 24, 2019, pp. 1-4.
Office Communication for U.S. Appl. No. 16/262,790 dated Dec. 12, 2019, pp. 1-10.
Office Communication for U.S. Appl. No. 16/234,334 dated Jan. 16, 2020, pp. 1-8.
Office Communication for U.S. Appl. No. 15/694,604 dated Nov. 20, 2019, pp. 1-8.
Office Communication for U.S. Appl. No. 16/262,756 dated Jan. 28, 2020, pp. 1-21.
Office Communication for U.S. Appl. No. 16/434,157 dated Jan. 29, 2020, pp. 1-9.
Office Communication for U.S. Appl. No. 16/262,790 dated Feb. 6, 2020, pp. 1-8.
Office Communication for U.S. Appl. No. 14/859,114 dated Mar. 13, 2020, pp. 1-21.
Office Communication for U.S. Appl. No. 16/752,451 dated Mar. 12, 2020, pp. 1-14.
Office Communication for U.S. Appl. No. 16/775,041 dated Mar. 11, 2020, pp. 1-8.
Office Communication for U.S. Appl. No. 16/779,362 dated Mar. 26, 2020, pp. 1-10.
Wikipedia clustered file system page from date Jul. 9, 2019, retrieved using the WayBackMachine, From https://web.archive.org/web/20190709083400/https://en.wikipedia.org/wiki/Clustered_file_system (Year: 2019), pp. 1-6.
Wikipedia raft page from date Jul. 16, 2019, retrieved using the WayBackMachine, from https://web.archive.org/web/20190716115001/https://en.wikipedia.org/wiki/Raft (computer_science) (Year: 2019), pp. 1-4.
Office Communication for U.S. Appl. No. 16/004,182 dated Mar. 23, 2020, pp. 1-4.
Office Communication for U.S. Appl. No. 16/752,509 dated Apr. 2, 2020, pp. 1-8.
Office Communication for U.S. Appl. No. 16/152,277 dated Apr. 3, 2020, pp. 1-10.
Office Communication for U.S. Appl. No. 16/004,182 dated Apr. 28, 2020, pp. 1-51.
Office Communication for U.S. Appl. No. 16/152,259 dated Apr. 29, 2020, pp. 1-19.
Office Communication for U.S. Appl. No. 14/859,114 dated Jun. 5, 2020, pp. 1-5.
Office Communication for U.S. Appl. No. 16/262,756 dated Jun. 8, 2020, pp. 1-22.
Office Communication for U.S. Appl. No. 14/595,598 dated Jul. 9, 2020, pp. 1-19.
Office Communication for U.S. Appl. No. 16/752,451 dated Jul. 23, 2020, pp. 1-8.
Office Communication for U.S. Appl. No. 14/859,114 dated Jul. 23, 2020, pp. 1-21.
Office Communication for U.S. Appl. No. 16/152,615 dated Aug. 6, 2020, pp. 1-7.
Office Communication for U.S. Appl. No. 16/779,362 dated Aug. 7, 2020, pp. 1-11.
Office Communication for U.S. Appl. No. 16/883,922 dated Aug. 7, 2020, pp. 1-13.
Office Communication for U.S. Appl. No. 16/775,041 dated Aug. 18, 2020, pp. 1-9.
Office Communication for U.S. Appl. No. 16/883,879 dated Sep. 1, 2020, pp. 1-11.
Extended European Search Report for European Patent Application No. 16812585.4 dated Nov. 7, 2018, pp. 1-9.
Comer, Douglas, "The Ubiquitous B-Tree," Computing Surveys, vol. 11, No. 2, Jun. 1979. Computer Science Department, Purdue University, West Lafayette, Indiana 47907, pp. 121-137.
Examination Report for European Patent Application No. 16812585.4 dated Jan. 2, 2020, pp. 1-6.
International Search Report and Written Opinion for International Patent Application No. PCT/US2016/038242 dated Oct. 11, 2016, pp. 1-11.
Office Communication for U.S. Appl. No. 14/595,598 dated Jul. 31, 2019, pp. 1-5.
Office Communication for U.S. Appl. No. 14/595,598 dated Sep. 20, 2018, pp. 1-18.
Office Communication for U.S. Appl. No. 14/595,598 dated Dec. 15, 2017, pp. 1-18.
Office Communication for U.S. Appl. No. 14/595,598 dated Feb. 24, 2017, pp. 1-8.
Office Communication for U.S. Appl. No. 14/595,598 dated Apr. 19, 2018, pp. 1-5.
Bloom, Burton H., "Space/Time Trade-offs in Hash Coding with Allowable Errors," Communications of the ACM, vol. 13, No. 7, Jul. 1970. Computer Usage Company, Newton Upper Falls, Massachusetts, pp. 422-426.
Office Communication for U.S. Appl. No. 16/262,756 dated Aug. 24, 2020, pp. 1-7.
Examination Report for European Patent Application No. 18155779.4 dated Oct. 8, 2019, pp. 1-4.
Office Communication for U.S. Appl. No. 16/152,259 dated Aug. 28, 2020, pp. 1-5.
Office Communication for U.S. Appl. No. 16/752,509 dated Aug. 11, 2020, pp. 1-7.
Office Communication for U.S. Appl. No. 14/595,598 dated Sep. 25, 2020, pp. 1-7.
Office Communication for U.S. Appl. No. 16/152,277 dated Oct. 16, 2020, pp. 1-10.
Office Communication for U.S. Appl. No. 16/152,615 dated Oct. 20, 2020, pp. 1-7.
Office Communication for U.S. Appl. No. 16/775,041 dated Nov. 3, 2020, pp. 1-5.
Office Communication for U.S. Appl. No. 17/062,500 dated Nov. 12, 2020, pp. 1-12.

(56) References Cited

OTHER PUBLICATIONS

Office Communication for U.S. Appl. No. 16/004,182 dated Nov. 30, 2020, pp. 1-55.
Office Communication for U.S. Appl. No. 14/859,114 dated Dec. 1, 2020, pp. 1-24.
Office Communication for U.S. Appl. No. 16/883,922 dated Dec. 2, 2020, pp. 1-9.
Office Communication for U.S. Appl. No. 16/883,879 dated Dec. 8, 2020, pp. 1-5.
Office Communication for U.S. Appl. No. 16/152,277 dated Dec. 28, 2020, pp. 1-5.
Office Communication for U.S. Appl. No. 16/004,182 dated Jan. 28, 2021, pp. 1-4.
Office Communication for U.S. Appl. No. 14/595,598 dated Feb. 4, 2021, pp. 1-19.
Office Communication for U.S. Appl. No. 17/115,529 dated Feb. 8, 2021, pp. 1-15.
Office Communication for U.S. Appl. No. 16/262,756 dated Feb. 10, 2021, pp. 1-19.
Office Communication for U.S. Appl. No. 17/114,384 dated Feb. 17, 2021, pp. 1-12.
Examination Report for European Patent Application No. 17206518.7 dated Feb. 23, 2021, pp. 1-6.
Office Communication for U.S. Appl. No. 14/859,114 dated Mar. 8, 2021, pp. 1-4.
Office Communication for U.S. Appl. No. 16/004,182 dated Mar. 8, 2021, pp. 1-60.
Office Communication for U.S. Appl. No. 17/062,500 dated Mar. 9, 2021, pp. 1-17.
Office Communication for U.S. Appl. No. 16/152,277 dated Mar. 18, 2021, pp. 1-10.
Office Communication for U.S. Appl. No. 17/160,698 dated Mar. 18, 2021, pp. 1-11.
Office Communication for U.S. Appl. No. 17/062,500 dated May 18, 2021, pp. 1-4.
Office Communication for U.S. Appl. No. 17/203,371 dated May 20, 2021, pp. 1-10.
Office Communication for U.S. Appl. No. 17/115,529 dated May 25, 2021, pp. 1-18.
Office Communication for U.S. Appl. No. 14/859,114 dated May 26, 2021, pp. 1-11.
Office Communication for U.S. Appl. No. 16/262,756 dated May 27, 2021, pp. 1-7.
Office Communication for U.S. Appl. No. 17/114,384 dated May 27, 2021, pp. 1-13.
Office Communication for U.S. Appl. No. 17/190,653 dated May 27, 2021, pp. 1-11.
Office Communication for U.S. Appl. No. 16/741,567 dated Jun. 8, 2021, pp. 1-5.
Office Communication for U.S. Appl. No. 17/203,452 dated Jun. 23, 2021, pp. 1-11.
Office Communication for U.S. Appl. No. 16/152,277 dated Jun. 25, 2021, pp. 1-10.
Office Communication for U.S. Appl. No. 16/004,182 dated Jul. 1, 2021, pp. 1-58.
Office Communication for U.S. Appl. No. 17/160,698 dated Jul. 2, 2021, pp. 1-12.
International Search Report and Written Opinion for International Patent Application No. PCT/US2021/023531 dated Jul. 6, 2021, pp. 1-7.
Office Communication for U.S. Appl. No. 17/062,500 dated Jul. 12, 2021, pp. 1-18.
Office Communication for U.S. Appl. No. 16/775,041 dated Jul. 21, 2021, pp. 1-11.
Office Communication for U.S. Appl. No. 17/114,384 dated Aug. 3, 2021, pp. 1-4.
Office Communication for U.S. Appl. No. 14/595,598 dated Aug. 6, 2021, pp. 1-20.
Office Communication for U.S. Appl. No. 17/115,529 dated Aug. 12, 2021, pp. 1-4.
Office Communication for U.S. Appl. No. 17/190,653 dated Aug. 27, 2021, pp. 1-11.
Office Communication for U.S. Appl. No. 17/114,384 dated Sep. 2, 2021, pp. 1-5.
Office Communication for U.S. Appl. No. 16/152,277 dated Sep. 3, 2021, pp. 1-4.
Office Communication for U.S. Appl. No. 16/004,182 dated Sep. 10, 2021, pp. 1-4.
Office Communication for U.S. Appl. No. 16/004,182 dated Sep. 29, 2021, pp. 1-11.
Office Communication for U.S. Appl. No. 16/152,277 dated Oct. 18, 2021, pp. 1-5.
International Search Report and Written Opinion for International Patent Application No. PCT/US2021/023525 dated Oct. 12, 2021, pp. 1-7.
Office Communication for U.S. Appl. No. 17/115,529 dated Oct. 22, 2021, pp. 1-20.
Office Communication for U.S. Appl. No. 17/062,500 dated Oct. 27, 2021, pp. 1-17.
Office Communication for U.S. Appl. No. 14/595,598 dated Oct. 28, 2021, pp. 1-6.
Office Communication for U.S. Appl. No. 16/741,567 dated Oct. 28, 2021, pp. 1-11.
Office Communication for U.S. Appl. No. 17/203,452 dated Nov. 2, 2021, pp. 1-13.
Office Communication for U.S. Appl. No. 17/190,653 dated Nov. 10, 2021, pp. 1-6.
Office Communication for U.S. Appl. No. 17/484,167 dated Nov. 18, 2021, pp. 1-15.
Office Communication for U.S. Appl. No. 17/504,289 dated Dec. 7, 2021, pp. 1-15.
Office Communication for U.S. Appl. No. 17/114,384 dated Dec. 14, 2021, pp. 1-7.
Office Communication for U.S. Appl. No. 17/190,653 dated Dec. 21, 2021, pp. 1-12.
Office Communication for U.S. Appl. No. 17/508,869 dated Dec. 22, 2021, pp. 1-9.
Office Communication for U.S. Appl. No. 17/491,017 dated Dec. 23, 2021, pp. 1-41.
Office Communication for U.S. Appl. No. 14/595,598 dated Dec. 29, 2021, pp. 1-19.
Office Communication for U.S. Appl. No. 17/062,500 dated Jan. 7, 2022, pp. 1-4.
Office Communication for U.S. Appl. No. 16/741,567 dated Jan. 11, 2022, pp. 1-6.
Office Communication for U.S. Appl. No. 17/203,452 dated Jan. 14, 2022, pp. 1-4.
Office Communication for U.S. Appl. No. 17/510,043 dated Jan. 21, 2022, pp. 1-13.
Office Communication for U.S. Appl. No. 16/741,567 dated Feb. 7, 2022, pp. 1-8.
Office Communication for U.S. Appl. No. 17/530,420 dated Feb. 10, 2022, pp. 1-24.
Office Communication for U.S. Appl. No. 16/004,182 dated Feb. 18, 2022, pp. 1-11.
Office Communication for U.S. Appl. No. 17/115,529 dated Feb. 18, 2022, pp. 1-20.
Office Communication for U.S. Appl. No. 17/203,452 dated Feb. 24, 2022, pp. 1-14.
Office Communication for U.S. Appl. No. 17/484,167 dated Mar. 11, 2022, pp. 1-11.
Office Communication for U.S. Appl. No. 17/062,500 dated Mar. 22, 2022, pp. 1-19.
Office Communication for U.S. Appl. No. 17/504,289 dated Mar. 28, 2022, pp. 1-9.
Office Communication for U.S. Appl. No. 17/588,120 dated Apr. 11, 2022, pp. 1-36.
Office Communication for U.S. Appl. No. 17/588,895 dated Apr. 27, 2022, pp. 1-6.
Office Communication for U.S. Appl. No. 17/190,653 dated Apr. 28, 2022, pp. 1-13.
Office Communication for U.S. Appl. No. 17/510,043 dated Apr. 29, 2022, pp. 1-10.

(56) References Cited

OTHER PUBLICATIONS

Office Communication for U.S. Appl. No. 17/115,529 dated Apr. 29, 2022, pp. 1-4.
Office Communication for U.S. Appl. No. 17/491,017 dated May 12, 2022, pp. 1-50.
Office Communication for U.S. Appl. No. 17/484,167 dated May 17, 2022, pp. 1-3.
Office Communication for U.S. Appl. No. 17/484,167 dated Jun. 10, 2022, pp. 1-5.
Office Communication for U.S. Appl. No. 17/203,452 dated Jun. 22, 2022, pp. 1-22.
Office Communication for U.S. Appl. No. 14/595,598 dated Jul. 13, 2022, pp. 1-9.
Office Communication for U.S. Appl. No. 17/062,500 dated Jul. 26, 2022, pp. 1-20.
Office Communication for U.S. Appl. No. 17/588,120 dated Jul. 27, 2022, pp. 1-34.
Office Communication for U.S. Appl. No. 17/190,653 dated Aug. 2, 2022, pp. 1-8.
Office Communication for U.S. Appl. No. 17/115,529 dated Aug. 8, 2022, pp. 1-21.
Office Communication for U.S. Appl. No. 17/588,895 dated Aug. 12, 2022, pp. 1-12.
Office Communication for U.S. Appl. No. 17/491,017 dated Aug. 17, 2022, pp. 1-5.
Office Communication for U.S. Appl. No. 17/203,452 dated Sep. 8, 2022, pp. 1-4.
Office Communication for U.S. Appl. No. 17/491,017 dated Sep. 15, 2022, pp. 1-55.
Office Communication for U.S. Appl. No. 17/864,190 dated Sep. 19, 2022, pp. 1-10.
Office Communication for U.S. Appl. No. 17/062,500 dated Oct. 5, 2022, pp. 1-4.
Office Communication for U.S. Appl. No. 17/203,452 dated Oct. 19, 2022, pp. 1-9.
Office Communication for U.S. Appl. No. 17/588,120 dated Oct. 21, 2022, pp. 1-5.
Office Communication for U.S. Appl. No. 17/203,452 dated Nov. 9, 2022, pp. 1-2.
Office Communication for U.S. Appl. No. 17/588,895 dated Nov. 9, 2022, pp. 1-11.
Office Communication for U.S. Appl. No. 17/115,529 dated Dec. 9, 2022, pp. 1-21.
Office Communication for U.S. Appl. No. 17/864,190 dated Jan. 24, 2023, pp. 1-12.
Office Communication for U.S. Appl. No. 17/588,120 dated Feb. 1, 2023, pp. 1-15.
Office Communication for U.S. Appl. No. 17/491,017 dated Feb. 10, 2023, pp. 1-57.
Office Communication for U.S. Appl. No. 18/070,705 dated Feb. 23, 2023, pp. 1-14.
Office Communication for U.S. Appl. No. 17/062,500 dated Feb. 27, 2023, pp. 1-23.

\* cited by examiner

```
global crc32_compute_modifier_asm:function
crc32_compute_modifier_asm:
    movdqa xmm2, [g] ; x^(-33) constant
    movdqa xmm3, [mu] ; load Barrett Reduction constant
    xor edi, esi ; crc(data) + target
    ; this implicitly introduces a 32 bit right shift, which is
good since
    ; the following Barrett Reduction expects the 64 bit value
in the two
    ; middle double words of the 128 bit register.
    movd xmm0, edi
    pclmulqdq xmm0, xmm2, 0x00

; Barrett Reduction
    movdqa xmm1, xmm0
    pclmulqdq xmm0, xmm3, 0x00
    pclmulqdq xmm0, xmm3, 0x10
    pxor xmm0, xmm1
    pextrd eax, xmm0, 2
    ret
```

ERROR RESISTANT WRITE-AHEAD LOG

TECHNICAL FIELD

The present invention relates generally to file systems, and more particularly, but not exclusively, to managing error resistant write-ahead logging as part of file system operations.

BACKGROUND

Modern computing often requires the collection, processing, or storage of very large data sets or file systems. Accordingly, to accommodate the capacity requirements as well as other requirements, such as, high availability, redundancy, latency/access considerations, or the like, modern file systems may be very large or distributed across multiple hosts, networks, or data centers, and so on. File systems may require various high volume or large capacity logging mechanisms to support various features such as data persistence, data recovery operations, file system restoration operations, or the like. Often reliable log systems may rely on low-level atomic transaction features that may be provided by storage devices. In some cases, such features may be constrained to limit atomic transactions to a fixed block (data) size. Accordingly, in some cases, log files may comprise several blocks that may be associated with each other such that each modification to a log file may be based on atomic transactions. In some circumstances, storage devices may erroneously write or move blocks to incorrect locations. In some cases, the occurrence of such errors may overwrite one or more blocks associated with log files resulting in corrupted log files. Thus, it is with respect to these considerations and others that the present invention has been made.

BRIEF DESCRIPTION OF THE DRAWINGS

Non-limiting and non-exhaustive embodiments of the present innovations are described with reference to the following drawings. In the drawings, like reference numerals refer to like parts throughout the various figures unless otherwise specified. For a better understanding of the described innovations, reference will be made to the following Detailed Description of Various Embodiments, which is to be read in association with the accompanying drawings, wherein:

FIG. 9 illustrate a portion of computer readable instructions for error resistant write-ahead log in accordance with one or more of the various embodiments;

DETAILED DESCRIPTION OF VARIOUS EMBODIMENTS

Figure 1:
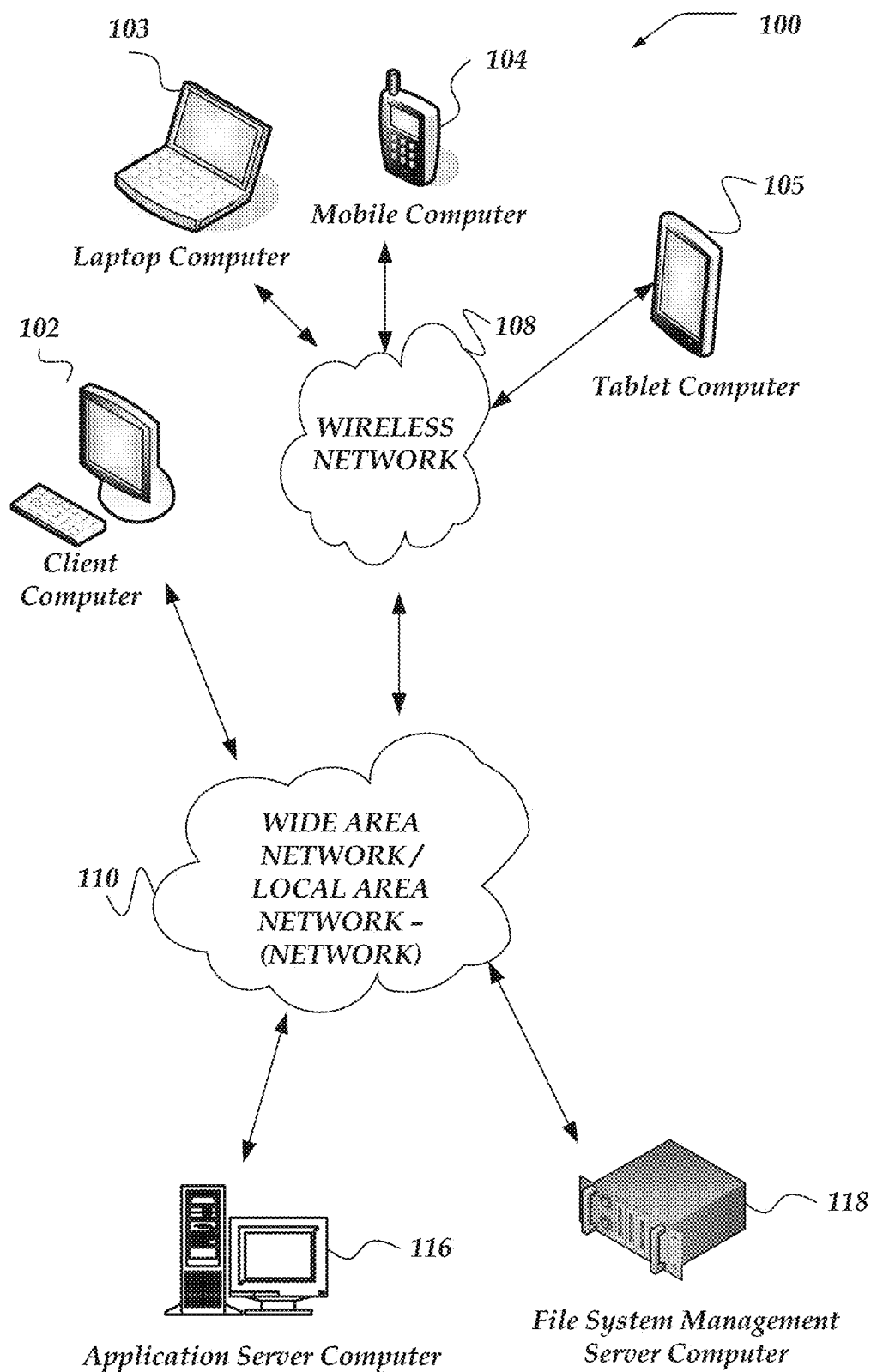
FIG. 1 illustrates a system environment in which various embodiments may be implemented.

Various embodiments now will be described more fully hereinafter with reference to the accompanying drawings, which form a part hereof, and which show, by way of illustration, specific exemplary embodiments by which the invention may be practiced. The embodiments may, however, be embodied in many different forms and should not be construed as limited to the embodiments set forth herein; rather, these embodiments are provided so that this disclosure will be thorough and complete, and will fully convey the scope of the embodiments to those skilled in the art. Among other things, the various embodiments may be methods, systems, media or devices. Accordingly, the various embodiments may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

For example, embodiments, the following terms are also used herein according to the corresponding meaning, unless the context clearly dictates otherwise.

As used herein the term, "engine" refers to logic embodied in hardware or software instructions, which can be written in a programming language, such as C, C++, Objective-C, COBOL, Java™, PHP, Perl, JavaScript, Ruby, VBScript, Microsoft .NET™ languages such as C#, or the like. An engine may be compiled into executable programs or written in interpreted programming languages. Software engines may be callable from other engines or from themselves. Engines described herein refer to one or more logical modules that can be merged with other engines or applications, or can be divided into sub-engines. The engines can be stored in non-transitory computer-readable medium or computer storage device and be stored on and executed by one or more general purpose computers, thus creating a special purpose computer configured to provide the engine.

As used herein the terms "file system object," or "object" refer to entities stored in a file system. These may include files, directories, or the like. In this document for brevity and clarity all objects stored in a file system may be referred to as file system objects.

As used herein the terms "block," or "file system object block" refer to the file system data objects that comprise a file system object. For example, small sized file system objects, such as, directory objects or small files may be comprised of a single block. Whereas larger file system objects, such as large document files may be comprised of many blocks. Blocks usually are arranged to have a fixed size to simplify the management of a file system. This may include fixing blocks to a particular size based on requirements associated with underlying storage hardware, such as, solid state drives (SSDs) or hard disk drives (HDDs), or the like. However, file system objects, such as, files may be of various sizes, comprised of the number of blocks necessary to represent or contain the entire file system object.

As used herein the term "write-ahead log,", or "WAL" refer to data structures for providing persist records to support atomicity and durability in file systems, databases, or other data stores. Typically a transaction may be considered "persisted" if the information or actions associated with the transaction are recorded in a corresponding WAL. In some cases, WALs may be configured to record meta-data associated with transactions rather than the storing the payload data in the WAL. In general, organization/operational policies may determine which transactions or which data is recorded in a given WAL. Often, storage devices (e.g., hard drives, solid-state drives, object stores, block devices, or the like) may guarantee atomic operations for transactions that fit within for a defined amount of data. Sometimes these may be referred to as the block size of the device.

As used herein the term "write-ahead log block" refers to data structures that represent a portion of a write-ahead log. Write-ahead log blocks may include meta-data that links them to subsequent blocks that comprise the write-ahead log. Write-ahead log blocks may include meta-data for managing the write-ahead log or other file system accounting/administration. Also, write-ahead log blocks may include a payload section that stores data associated with the actions, events, or operations, of an underlying file system operation.

As used herein the term "write-ahead log segment," "log segment," or "segment" refer to one or more linked write-ahead log blocks separate from a write-ahead log. A log segment may include one or more write-ahead log blocks associated with a pending operation to append the blocks in the log segment to a proper write-ahead log.

As used herein the terms "cyclic redundancy check," or "CRC" refer to an error-detecting code often used to detect accidental changes to digital data. One of ordinary skill in the art will appreciate that there may be various methods to compute CRCs for digital data.

As used herein, the term "tweak" refers to computing a data value that if included in a write-ahead log block will result in the write-ahead log block having a particular target CRC value.

As used herein, the term "tweak data" refers to space in a write-ahead log block reserved for storing values determined by tweak actions that result in a block having a desired CRC value. Accordingly, modifying the tweak data may result in the write-ahead log block having a different CRC.

As used herein the term "configuration information" refers to information that may include rule based policies, pattern matching, scripts (e.g., computer readable instructions), or the like, that may be provided from various sources, including, configuration files, databases, user input, built-in defaults, or the like, or combination thereof.

The following briefly describes embodiments of the invention in order to provide a basic understanding of some aspects of the invention. This brief description is not intended as an extensive overview. It is not intended to identify key or critical elements, or to delineate or otherwise narrow the scope. Its purpose is merely to present some concepts in a simplified form as a prelude to the more detailed description that is presented later.

Briefly stated, various embodiments are directed to error resistant logging. In one or more of the various embodiments, a write-ahead log (WAL) for preserving a verifiable record of file system activity may be provided such that the WAL may include a sequence of log blocks that each may include a cyclic redundancy check (CRC) value of a next adjacent log block in the WAL and a last log block in the WAL may be a tail-block with a placeholder value for a CRC value of its next adjacent log block in the WAL.

In one or more of the various embodiments, in response to executing a file system operation associated with payload data, further actions may be performed, including: generating one or more log blocks based on the payload data such that the one or more log blocks each include a portion of the payload data; generating a log segment that includes the one or more log blocks such that each log block in the log segment includes a reference to a next adjacent log block in the log segment; modifying a portion of the contents of a head-block of the log segment such that the modified head-block of the log segment has a CRC value that matches a CRC value of the tail-block of the WAL; copying the contents of the modified head-block of the log segment into the tail-block of the WAL; providing an acknowledgment that the file system operation is executed; or the like.

In one or more of the various embodiments, modifying the portion of the contents of the head-block of the log segment may include: determining a tweak data field in the head-block of the log segment; determining a remainder portion of the head-block of the log segment absent the tweak data field; determining a value for the tweak data field based on a combination of the determined value of the tweak data field in the head-block of the log segment and the remainder portion of the head-block of the log segment such that a CRC value for the combination of the determined value of the tweak data field of the head-block of the log segment and the remainder portion of the head-block of the log segment matches the CRC value of the tail-block of the WAL; or the like.

In one or more of the various embodiments, a sequence of one or more remove log blocks in the WAL that are designated for removal from the WAL may be determined based on another file system operation. In some embodiments, a first log block in the WAL that is prior to and adjacent to the sequence of the one or more remove log blocks may be determined. In some embodiments, a reference in the first log block may be updated to point to a second log block in the WAL that is subsequent to and adjacent to the sequence of the one or more remove log blocks. In some embodiments, a reference to a next log block in the first log block may be updated to point to the second log block. In some embodiments, a next log block CRC field in the first log block may be updated to match a CRC field in the second log block. And, in some embodiments, a value of a tweak data field in the first log block may be modified to ensure a CRC field of the first block remains unchanged.

In one or more of the various embodiments, each log block in the WAL may include, a CRC value of the log block, a CRC value of its next adjacent log block, a tweak data field, a payload data section; or the like.

In one or more of the various embodiments, copying the contents of the head-block of the log segment into the tail-block of the WAL, may include: determining a location in memory of the tail-block of the WAL; replacing the contents of the tail-block of the WAL with the contents of the head-block of the log segment such that the location of the tail-block of the WAL remains unchanged; or the like.

Illustrated Operating Environment

FIG. 1 shows components of one embodiment of an environment in which embodiments of the invention may be practiced. Not all of the components may be required to practice the invention, and variations in the arrangement and type of the components may be made without departing from the spirit or scope of the invention. As shown, system 100 of FIG. 1 includes local area networks (LANs)/wide area networks (WANs)–(network) 110, wireless network 108, client computers 102-105, application server computer 116, file system management server computer 118, or the like.

At least one embodiment of client computers 102-105 is described in more detail below in conjunction with FIG. 2. In one embodiment, at least some of client computers 102-105 may operate over one or more wired or wireless networks, such as networks 108, or 110. Generally, client computers 102-105 may include virtually any computer capable of communicating over a network to send and receive information, perform various online activities, offline actions, or the like. In one embodiment, one or more of client computers 102-105 may be configured to operate within a business or other entity to perform a variety of services for the business or other entity. For example, client computers 102-105 may be configured to operate as a web server, firewall, client application, media player, mobile telephone, game console, desktop computer, or the like. However, client computers 102-105 are not constrained to these services and may also be employed, for example, as for end-user computing in other embodiments. It should be recognized that more or less client computers (as shown in FIG. 1) may be included within a system such as described herein, and embodiments are therefore not constrained by the number or type of client computers employed.

Computers that may operate as client computer 102 may include computers that typically connect using a wired or wireless communications medium such as personal computers, multiprocessor systems, microprocessor-based or programmable electronic devices, network PCs, or the like. In some embodiments, client computers 102-105 may include virtually any portable computer capable of connecting to another computer and receiving information such as, laptop computer 103, mobile computer 104, tablet computers 105, or the like. However, portable computers are not so limited and may also include other portable computers such as cellular telephones, display pagers, radio frequency (RF) devices, infrared (IR) devices, Personal Digital Assistants (PDAs), handheld computers, wearable computers, integrated devices combining one or more of the preceding computers, or the like. As such, client computers 102-105 typically range widely in terms of capabilities and features. Moreover, client computers 102-105 may access various computing applications, including a browser, or other web-based application.

A web-enabled client computer may include a browser application that is configured to send requests and receive responses over the web. The browser application may be configured to receive and display graphics, text, multimedia, and the like, employing virtually any web-based language. In one embodiment, the browser application is enabled to employ JavaScript, HyperText Markup Language (HTML), eXtensible Markup Language (XML), JavaScript Object Notation (JSON), Cascading Style Sheets (CS S), or the like, or combination thereof, to display and send a message. In one embodiment, a user of the client computer may employ the browser application to perform various activities over a network (online). However, another application may also be used to perform various online activities.

Client computers 102-105 also may include at least one other client application that is configured to receive or send content between another computer. The client application may include a capability to send or receive content, or the like. The client application may further provide information that identifies itself, including a type, capability, name, and the like. In one embodiment, client computers 102-105 may uniquely identify themselves through any of a variety of mechanisms, including an Internet Protocol (IP) address, a phone number, Mobile Identification Number (MIN), an electronic serial number (ESN), a client certificate, or other device identifier. Such information may be provided in one or more network packets, or the like, sent between other client computers, application server computer 116, file system management server computer 118, or other computers.

Client computers 102-105 may further be configured to include a client application that enables an end-user to log into an end-user account that may be managed by another computer, such as application server computer 116, file system management server computer 118, or the like. Such an end-user account, in one non-limiting example, may be configured to enable the end-user to manage one or more online activities, including in one non-limiting example, project management, software development, system administration, configuration management, search activities, social networking activities, browse various websites, communicate with other users, or the like. Also, client computers may be arranged to enable users to display reports, interactive user-interfaces, or results provided by application server computer 116, file system management server computer 118, or the like.

Wireless network 108 is configured to couple client computers 103-105 and its components with network 110. Wireless network 108 may include any of a variety of wireless sub-networks that may further overlay stand-alone ad-hoc networks, and the like, to provide an infrastructure-oriented connection for client computers 103-105. Such sub-networks may include mesh networks, Wireless LAN (WLAN) networks, cellular networks, and the like. In one embodiment, the system may include more than one wireless network.

Wireless network 108 may further include an autonomous system of terminals, gateways, routers, and the like connected by wireless radio links, and the like. These connectors may be configured to move freely and randomly and organize themselves arbitrarily, such that the topology of wireless network 108 may change rapidly.

Wireless network 108 may further employ a plurality of access technologies including 2nd (2G), 3rd (3G), 4th (4G) 5th (5G) generation radio access for cellular systems, WLAN, Wireless Router (WR) mesh, and the like. Access technologies such as 2G, 3G, 4G, 5G, and future access networks may enable wide area coverage for mobile computers, such as client computers 103-105 with various degrees of mobility. In one non-limiting example, wireless network 108 may enable a radio connection through a radio network access such as Global System for Mobil communication (GSM), General Packet Radio Services (GPRS), Enhanced Data GSM Environment (EDGE), code division multiple access (CDMA), time division multiple access (TDMA), Wideband Code Division Multiple Access (WCDMA), High Speed Downlink Packet Access (HSDPA), Long Term Evolution (LTE), and the like. In essence, wireless network 108 may include virtually any wireless communication mechanism by which information may travel between client computers 103-105 and another computer, network, a cloud-based network, a cloud instance, or the like.

Network 110 is configured to couple network computers with other computers, including, application server computer 116, file system management server computer 118, client computers 102, and client computers 103-105 through wireless network 108, or the like. Network 110 is enabled to employ any form of computer readable media for communicating information from one electronic device to another. Also, network 110 can include the Internet in addition to local area networks (LANs), wide area networks (WANs), direct connections, such as through a universal serial bus (USB) port, Ethernet port, other forms of computer-readable media, or any combination thereof. On an interconnected set of LANs, including those based on differing architectures and protocols, a router acts as a link between LANs, enabling messages to be sent from one to another. In addition, communication links within LANs typically include twisted wire pair or coaxial cable, while communication links between networks may utilize analog telephone lines, full or fractional dedicated digital lines including T1, T2, T3, and T4, or other carrier mechanisms including, for example, E-carriers, Integrated Services Digital Networks (ISDNs), Digital Subscriber Lines (DSLs), wireless links including satellite links, or other communications links known to those skilled in the art. Moreover, communication links may further employ any of a variety of digital signaling technologies, including without limit, for example, DS-0, DS-1, DS-2, DS-3, DS-4, OC-3, OC-12, OC-48, or the like. Furthermore, remote computers and other related electronic devices could be remotely connected to either LANs or WANs via a modem and temporary telephone link. In one embodiment, network 110 may be configured to transport information of an Internet Protocol (IP).

Additionally, communication media typically embodies computer readable instructions, data structures, program modules, or other transport mechanism and includes any information non-transitory delivery media or transitory delivery media. By way of example, communication media includes wired media such as twisted pair, coaxial cable, fiber optics, wave guides, and other wired media and wireless media such as acoustic, RF, infrared, and other wireless media.

Also, one embodiment of file system management server computer 118 is described in more detail below in conjunction with FIG. 3. Although FIG. 1 illustrates file system management server computer 118, or the like, each as a single computer, the innovations or embodiments are not so limited. For example, one or more functions of file system management server computer 118, or the like, may be distributed across one or more distinct network computers.

Moreover, in one or more embodiments, file system management server computer 118 may be implemented using a plurality of network computers. Further, in one or more of the various embodiments, file system management server computer 118, or the like, may be implemented using one or more cloud instances in one or more cloud networks. Accordingly, these innovations and embodiments are not to be construed as being limited to a single environment, and other configurations, and other architectures are also envisaged.

Illustrative Client Computer

Figure 2:
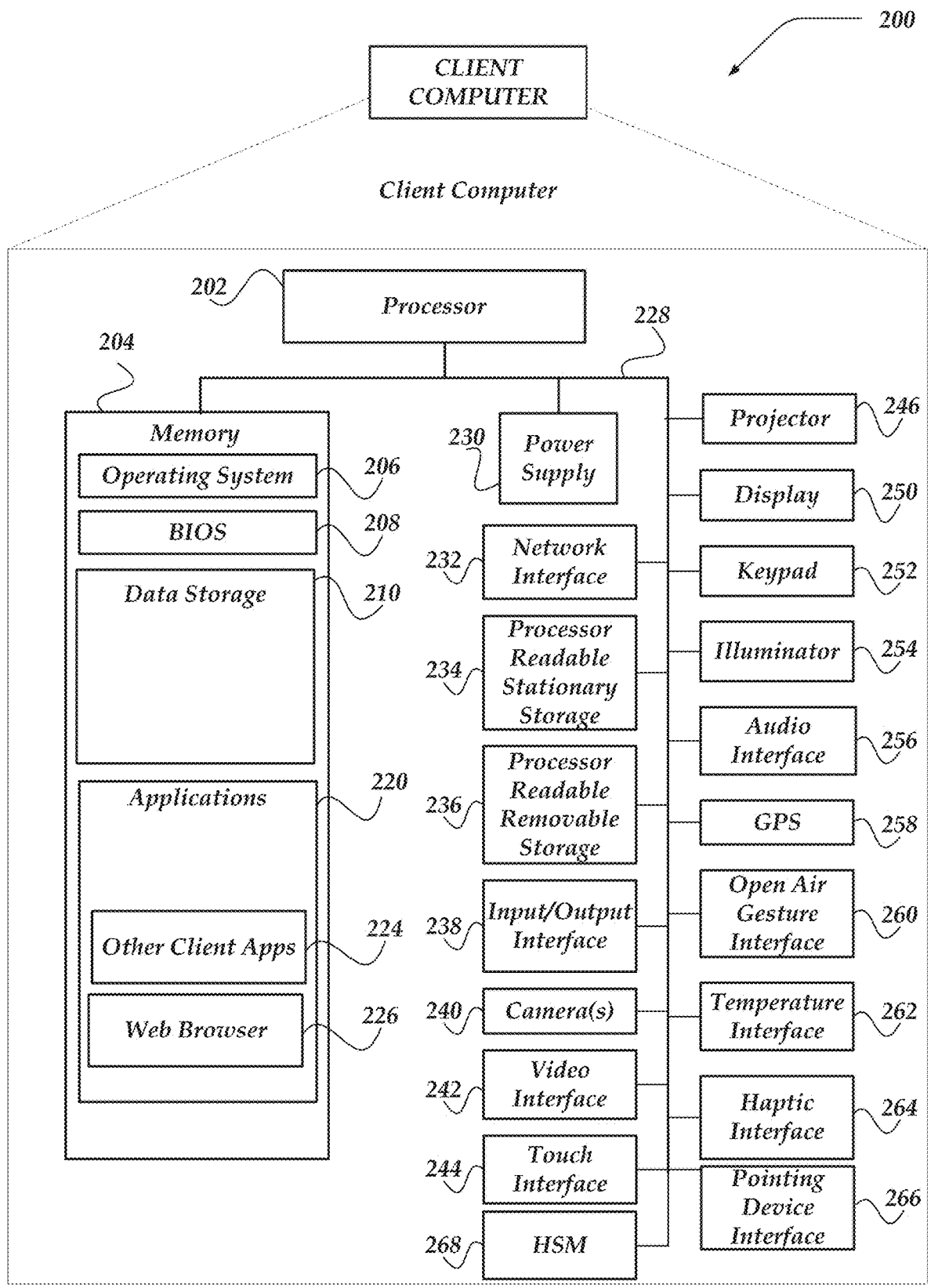
FIG. 2 illustrates a schematic embodiment of a client computer.

FIG. 2 shows one embodiment of client computer 200 that may include many more or less components than those shown. Client computer 200 may represent, for example, one or more embodiment of mobile computers or client computers shown in FIG. 1.

Client computer 200 may include processor 202 in communication with memory 204 via bus 228. Client computer 200 may also include power supply 230, network interface 232, audio interface 256, display 250, keypad 252, illuminator 254, video interface 242, input/output interface 238, haptic interface 264, global positioning systems (GPS) receiver 258, open air gesture interface 260, temperature interface 262, camera(s) 240, projector 246, pointing device interface 266, processor-readable stationary storage device 234, and processor-readable removable storage device 236. Client computer 200 may optionally communicate with a base station (not shown), or directly with another computer. And in one embodiment, although not shown, a gyroscope may be employed within client computer 200 to measuring or maintaining an orientation of client computer 200.

Power supply 230 may provide power to client computer 200. A rechargeable or non-rechargeable battery may be used to provide power. The power may also be provided by an external power source, such as an AC adapter or a powered docking cradle that supplements or recharges the battery.

Network interface 232 includes circuitry for coupling client computer 200 to one or more networks, and is constructed for use with one or more communication protocols and technologies including, but not limited to, protocols and technologies that implement any portion of the OSI model for mobile communication (GSM), CDMA, time division multiple access (TDMA), UDP, TCP/IP, SMS, MMS, GPRS, WAP, UWB, WiMax, SIP/RTP, GPRS, EDGE, WCDMA, LTE, UMTS, OFDM, CDMA2000, EV-DO, HSDPA, 5G, or any of a variety of other wireless communication protocols. Network interface 232 is sometimes known as a transceiver, transceiving device, or network interface card (MC).

Audio interface 256 may be arranged to produce and receive audio signals such as the sound of a human voice. For example, audio interface 256 may be coupled to a speaker and microphone (not shown) to enable telecommunication with others or generate an audio acknowledgment for some action. A microphone in audio interface 256 can also be used for input to or control of client computer 200, e.g., using voice recognition, detecting touch based on sound, and the like.

Display 250 may be a liquid crystal display (LCD), gas plasma, electronic ink, light emitting diode (LED), Organic LED (OLED) or any other type of light reflective or light transmissive display that can be used with a computer. Display 250 may also include a touch interface 244 arranged to receive input from an object such as a stylus or a digit from a human hand, and may use resistive, capacitive, surface acoustic wave (SAW), infrared, radar, or other technologies to sense touch or gestures.

Projector 246 may be a remote handheld projector or an integrated projector that is capable of projecting an image on a remote wall or any other reflective object such as a remote screen.

Video interface 242 may be arranged to capture video images, such as a still photo, a video segment, an infrared video, or the like. For example, video interface 242 may be coupled to a digital video camera, a web-camera, or the like. Video interface 242 may comprise a lens, an image sensor, and other electronics. Image sensors may include a complementary metal-oxide-semiconductor (CMOS) integrated circuit, charge-coupled device (CCD), or any other integrated circuit for sensing light.

Keypad 252 may comprise any input device arranged to receive input from a user. For example, keypad 252 may include a push button numeric dial, or a keyboard. Keypad 252 may also include command buttons that are associated with selecting and sending images.

Illuminator 254 may provide a status indication or provide light. Illuminator 254 may remain active for specific periods of time or in response to event messages. For example, when illuminator 254 is active, it may back-light the buttons on keypad 252 and stay on while the client computer is powered. Also, illuminator 254 may back-light these buttons in various patterns when particular actions are performed, such as dialing another client computer. Illuminator 254 may also cause light sources positioned within a transparent or translucent case of the client computer to illuminate in response to actions.

Further, client computer 200 may also comprise hardware security module (HSM) 268 for providing additional tamper resistant safeguards for generating, storing or using security/cryptographic information such as, keys, digital certificates, passwords, passphrases, two-factor authentication information, or the like. In some embodiments, hardware security module may be employed to support one or more standard public key infrastructures (PKI), and may be employed to generate, manage, or store keys pairs, or the like. In some embodiments, HSM 268 may be a stand-alone computer, in other cases, HSM 268 may be arranged as a hardware card that may be added to a client computer.

Client computer 200 may also comprise input/output interface 238 for communicating with external peripheral devices or other computers such as other client computers and network computers. The peripheral devices may include an audio headset, virtual reality headsets, display screen glasses, remote speaker system, remote speaker and microphone system, and the like. Input/output interface 238 can utilize one or more technologies, such as Universal Serial Bus (USB), Infrared, WiFi, WiMax, Bluetooth™, and the like.

Input/output interface 238 may also include one or more sensors for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), or the like. Sensors may be one or more hardware sensors that collect or measure data that is external to client computer 200.

Haptic interface 264 may be arranged to provide tactile feedback to a user of the client computer. For example, the haptic interface 264 may be employed to vibrate client computer 200 in a particular way when another user of a computer is calling. Temperature interface 262 may be used to provide a temperature measurement input or a temperature changing output to a user of client computer 200. Open air gesture interface 260 may sense physical gestures of a user of client computer 200, for example, by using single or stereo video cameras, radar, a gyroscopic sensor inside a computer held or worn by the user, or the like. Camera 240 may be used to track physical eye movements of a user of client computer 200.

GPS transceiver 258 can determine the physical coordinates of client computer 200 on the surface of the Earth, which typically outputs a location as latitude and longitude values. GPS transceiver 258 can also employ other geo-positioning mechanisms, including, but not limited to, tri-angulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of client computer 200 on the surface of the Earth. It is understood that under different conditions, GPS transceiver 258 can determine a physical location for client computer 200. In one or more embodiments, however, client computer 200 may, through other components, provide other information that may be employed to determine a physical location of the client computer, including for example, a Media Access Control (MAC) address, IP address, and the like.

In at least one of the various embodiments, applications, such as, operating system 206, other client apps 224, web browser 226, or the like, may be arranged to employ geo-location information to select one or more localization features, such as, time zones, languages, currencies, calendar formatting, or the like. Localization features may be used in display objects, data models, data objects, user-interfaces, reports, as well as internal processes or databases. In at least one of the various embodiments, geo-location information used for selecting localization information may be provided by GPS 258. Also, in some embodiments, geolocation information may include information provided using one or more geolocation protocols over the networks, such as, wireless network 108 or network 111.

Human interface components can be peripheral devices that are physically separate from client computer 200, allowing for remote input or output to client computer 200. For example, information routed as described here through human interface components such as display 250 or keyboard 252 can instead be routed through network interface 232 to appropriate human interface components located remotely. Examples of human interface peripheral components that may be remote include, but are not limited to, audio devices, pointing devices, keypads, displays, cameras, projectors, and the like. These peripheral components may communicate over a Pico Network such as Bluetooth™, Zigbee™ and the like. One non-limiting example of a client computer with such peripheral human interface components is a wearable computer, which might include a remote pico projector along with one or more cameras that remotely communicate with a separately located client computer to sense a user's gestures toward portions of an image projected by the pico projector onto a reflected surface such as a wall or the user's hand.

A client computer may include web browser application 226 that is configured to receive and to send web pages, web-based messages, graphics, text, multimedia, and the like. The client computer's browser application may employ virtually any programming language, including a wireless application protocol messages (WAP), and the like. In one or more embodiments, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), HTML5, and the like.

Memory 204 may include RAM, ROM, or other types of memory. Memory 204 illustrates an example of computer-readable storage media (devices) for storage of information such as computer-readable instructions, data structures, program modules or other data. Memory 204 may store BIOS 208 for controlling low-level operation of client computer 200. The memory may also store operating system 206 for controlling the operation of client computer 200. It will be appreciated that this component may include a general-purpose operating system such as a version of UNIX, or Linux®, or a specialized client computer communication operating system such as Windows Phone™, or the Symbian® operating system. The operating system may include, or interface with a Java virtual machine module that enables control of hardware components or operating system operations via Java application programs.

Memory 204 may further include one or more data storage 210, which can be utilized by client computer 200 to store, among other things, applications 220 or other data. For example, data storage 210 may also be employed to store information that describes various capabilities of client computer 200. The information may then be provided to another device or computer based on any of a variety of methods, including being sent as part of a header during a communication, sent upon request, or the like. Data storage 210 may also be employed to store social networking information including address books, buddy lists, aliases, user profile information, or the like. Data storage 210 may further include program code, data, algorithms, and the like, for use by a processor, such as processor 202 to execute and perform actions. In one embodiment, at least some of data storage 210 might also be stored on another component of client computer 200, including, but not limited to, non-transitory processor-readable removable storage device 236, processor-readable stationary storage device 234, or even external to the client computer.

Applications 220 may include computer executable instructions which, when executed by client computer 200, transmit, receive, or otherwise process instructions and data. Applications 220 may include, for example, other client applications 224, web browser 226, or the like. Client computers may be arranged to exchange communications one or more servers.

Other examples of application programs include calendars, search programs, email client applications, IM applications, SMS applications, Voice Over Internet Protocol (VOIP) applications, contact managers, task managers, transcoders, database programs, word processing programs, security applications, spreadsheet programs, games, search programs, visualization applications, and so forth.

Additionally, in one or more embodiments (not shown in the figures), client computer 200 may include an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. Also, in one or more embodiments (not shown in the figures), client computer 200 may include one or more hardware micro-controllers instead of CPUs. In one or more embodiments, the one or more micro-controllers may directly execute their own embedded logic to perform actions and access its own internal memory and its own external Input and Output Interfaces (e.g., hardware pins or wireless transceivers) to perform actions, such as System On a Chip (SOC), or the like.

Illustrative Network Computer

Figure 3:
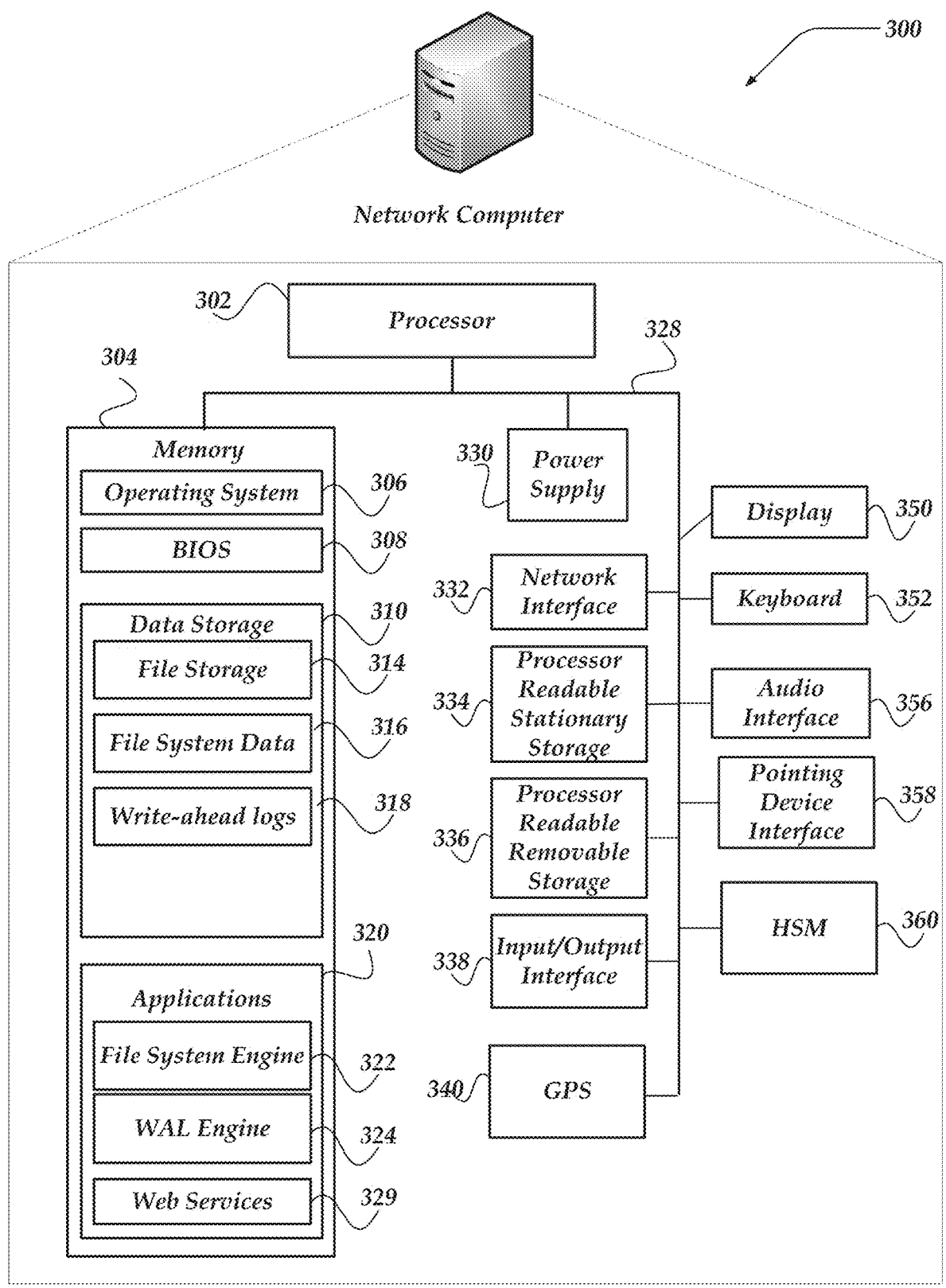
FIG. 3 illustrates a schematic embodiment of a network computer.

FIG. 3 shows one embodiment of network computer 300 that may be included in a system implementing one or more of the various embodiments. Network computer 300 may include many more or less components than those shown in FIG. 3. However, the components shown are sufficient to disclose an illustrative embodiment for practicing these innovations. Network computer 300 may represent, for example, one or more embodiments of a file system management server computer such as file system management server computer 118, or the like, of FIG. 1.

Network computers, such as, network computer 300 may include a processor 302 that may be in communication with a memory 304 via a bus 328. In some embodiments, processor 302 may be comprised of one or more hardware processors, or one or more processor cores. In some cases, one or more of the one or more processors may be specialized processors designed to perform one or more specialized actions, such as, those described herein. Network computer 300 also includes a power supply 330, network interface 332, audio interface 356, display 350, keyboard 352, input/output interface 338, processor-readable stationary storage device 334, and processor-readable removable storage device 336. Power supply 330 provides power to network computer 300.

Network interface 332 includes circuitry for coupling network computer 300 to one or more networks, and is constructed for use with one or more communication protocols and technologies including, but not limited to, protocols and technologies that implement any portion of the Open Systems Interconnection model (OSI model), global system for mobile communication (GSM), code division multiple access (CDMA), time division multiple access (TDMA), user datagram protocol (UDP), transmission control protocol/Internet protocol (TCP/IP), Short Message Service (SMS), Multimedia Messaging Service (MMS), general packet radio service (GPRS), WAP, ultra-wide band (UWB), IEEE 802.16 Worldwide Interoperability for Microwave Access (WiMax), Session Initiation Protocol/Real-time Transport Protocol (SIP/RTP), 5G, or any of a variety of other wired and wireless communication protocols. Network interface 332 is sometimes known as a transceiver, transceiving device, or network interface card (NIC). Network computer 300 may optionally communicate with a base station (not shown), or directly with another computer.

Audio interface 356 is arranged to produce and receive audio signals such as the sound of a human voice. For example, audio interface 356 may be coupled to a speaker and microphone (not shown) to enable telecommunication with others or generate an audio acknowledgment for some action. A microphone in audio interface 356 can also be used for input to or control of network computer 300, for example, using voice recognition.

Display 350 may be a liquid crystal display (LCD), gas plasma, electronic ink, light emitting diode (LED), Organic LED (OLED) or any other type of light reflective or light transmissive display that can be used with a computer. In some embodiments, display 350 may be a handheld projector or pico projector capable of projecting an image on a wall or other object.

Network computer 300 may also comprise input/output interface 338 for communicating with external devices or computers not shown in FIG. 3. Input/output interface 338 can utilize one or more wired or wireless communication technologies, such as USB™, Firewire™, WiFi, WiMax, Thunderbolt™, Infrared, Bluetooth™, Zigbee™, serial port, parallel port, and the like.

Also, input/output interface 338 may also include one or more sensors for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), or the like. Sensors may be one or more hardware sensors that collect or measure data that is external to network computer 300. Human interface components can be physically separate from network computer 300, allowing for remote input or output to network computer 300. For example, information routed as described here through human interface components such as display 350 or keyboard 352 can instead be routed through the network interface 332 to appropriate human interface components located elsewhere on the network. Human interface components include any component that allows the computer to take input from, or send output to, a human user of a computer. Accordingly, pointing devices such as mice, styluses, track balls, or the like, may communicate through pointing device interface 358 to receive user input.

GPS transceiver 340 can determine the physical coordinates of network computer 300 on the surface of the Earth, which typically outputs a location as latitude and longitude values. GPS transceiver 340 can also employ other geo-positioning mechanisms, including, but not limited to, tri-angulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of network computer 300 on the surface of the Earth. It is understood that under different conditions, GPS transceiver 340 can determine a physical location for network computer 300. In one or more embodiments, however, network computer 300 may, through other components, provide other information that may be employed to determine a physical location of the client computer, including for example, a Media Access Control (MAC) address, IP address, and the like.

In at least one of the various embodiments, applications, such as, operating system 306, file system engine 322, WAL engine 324, web services 329, or the like, may be arranged to employ geo-location information to select one or more localization features, such as, time zones, languages, currencies, currency formatting, calendar formatting, or the like. Localization features may be used in user interfaces, dashboards, reports, as well as internal processes or databases. In at least one of the various embodiments, geo-location information used for selecting localization information may be provided by GPS 340. Also, in some embodiments, geolocation information may include information provided using one or more geolocation protocols over the networks, such as, wireless network 108 or network 111.

Memory 304 may include Random Access Memory (RAM), Read-Only Memory (ROM), or other types of memory. Memory 304 illustrates an example of computer-readable storage media (devices) for storage of information such as computer-readable instructions, data structures, program modules or other data. Memory 304 stores a basic input/output system (BIOS) 308 for controlling low-level operation of network computer 300. The memory also stores an operating system 306 for controlling the operation of network computer 300. It will be appreciated that this component may include a general-purpose operating system such as a version of UNIX, or Linux®, or a specialized operating system such as Microsoft Corporation's Windows® operating system, or the Apple Corporation's macOS® operating system. The operating system may include, or interface with one or more virtual machine modules, such as, a Java virtual machine module that enables control of hardware components or operating system operations via Java application programs. Likewise, other runtime environments may be included.

Memory 304 may further include one or more data storage 310, which can be utilized by network computer 300 to store, among other things, applications 320 or other data. For example, data storage 310 may also be employed to store information that describes various capabilities of network computer 300. The information may then be provided to another device or computer based on any of a variety of methods, including being sent as part of a header during a communication, sent upon request, or the like. Data storage 310 may also be employed to store social networking information including address books, friend lists, aliases, user profile information, or the like. Data storage 310 may further include program code, data, algorithms, and the like, for use by a processor, such as processor 302 to execute and perform actions such as those actions described below. In one embodiment, at least some of data storage 310 might also be stored on another component of network computer 300, including, but not limited to, non-transitory media inside processor-readable removable storage device 336, processor-readable stationary storage device 334, or any other computer-readable storage device within network computer 300, or even external to network computer 300. Data storage 310 may include, for example, file storage 314, file system data 316, write-ahead logs 318, or the like.

Applications 320 may include computer executable instructions which, when executed by network computer 300, transmit, receive, or otherwise process messages (e.g., SMS, Multimedia Messaging Service (MMS), Instant Message (IM), email, or other messages), audio, video, and enable telecommunication with another user of another mobile computer. Other examples of application programs include calendars, search programs, email client applications, IM applications, SMS applications, Voice Over Internet Protocol (VOIP) applications, contact managers, task managers, transcoders, database programs, word processing programs, security applications, spreadsheet programs, games, search programs, and so forth. Applications 320 may include file system engine 322, WAL engine 324, web services 329, or the like, that may be arranged to perform actions for embodiments described below. In one or more of the various embodiments, one or more of the applications may be implemented as modules or components of another application. Further, in one or more of the various embodiments, applications may be implemented as operating system extensions, modules, plugins, or the like.

Furthermore, in one or more of the various embodiments, file system engine 322, WAL engine 324, web services 329, or the like, may be operative in a cloud-based computing environment. In one or more of the various embodiments, these applications, and others, that comprise the management platform may be executing within virtual machines or virtual servers that may be managed in a cloud-based based computing environment. In one or more of the various embodiments, in this context the applications may flow from one physical network computer within the cloud-based environment to another depending on performance and scaling considerations automatically managed by the cloud computing environment. Likewise, in one or more of the various embodiments, virtual machines or virtual servers dedicated to file system engine 322, WAL engine 324, web services 329, or the like, may be provisioned and de-commissioned automatically.

Also, in one or more of the various embodiments, file system engine 322, WAL engine 324, web services 329, or the like, may be located in virtual servers running in a cloud-based computing environment rather than being tied to one or more specific physical network computers.

Further, network computer 300 may also comprise hardware security module (HSM) 360 for providing additional tamper resistant safeguards for generating, storing or using security/cryptographic information such as, keys, digital certificates, passwords, passphrases, two-factor authentication information, or the like. In some embodiments, hardware security module may be employed to support one or more standard public key infrastructures (PKI), and may be employed to generate, manage, or store keys pairs, or the like. In some embodiments, HSM 360 may be a stand-alone network computer, in other cases, HSM 360 may be arranged as a hardware card that may be installed in a network computer.

Additionally, in one or more embodiments (not shown in the figures), network computer 300 may include an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. Also, in one or more embodiments (not shown in the figures), the network computer may include one or more hardware microcontrollers instead of a CPU. In one or more embodiments, the one or more microcontrollers may directly execute their own embedded logic to perform actions and access their own internal memory and their own external Input and Output Interfaces (e.g., hardware pins or wireless transceivers) to perform actions, such as System On a Chip (SOC), or the like.

Illustrative Logical System Architecture

Figure 4:
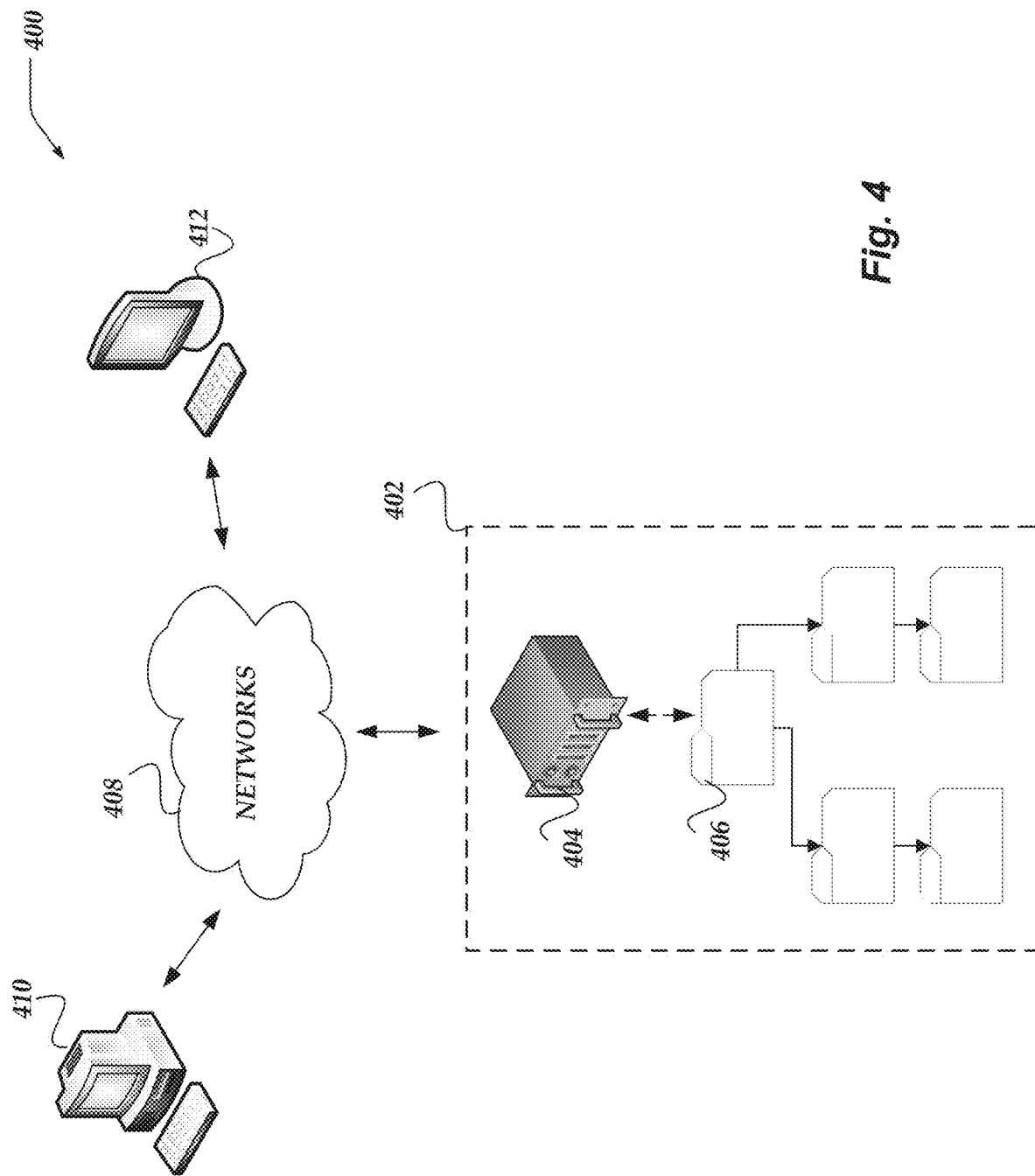
FIG. 4 illustrates a logical architecture of a system for error resistant write-ahead logging in accordance with one or more of the various embodiments.

FIG. 4 illustrates a logical architecture of system 400 for error resistant write-ahead logging in accordance with one or more of the various embodiments. In one or more of the various embodiments, one or more file systems, such as, file system 402 may be arranged to be communicatively coupled to one or more networks, such as, networks 408. Accordingly, in one or more of the various embodiments, one or more clients, such as, client computer 410 or client computer 412 may be arranged to access file system 402 over networks 408. In some embodiments, clients of file system 402 may include users, services, programs, computers, devices, or the like, that may be enabled to perform one or more data related operations, such as, creating, reading, updating, or deleting data (e.g., file system objects, documents, or the like) that may be stored in file system 402.

In some embodiments, file system 402 may comprise one or more file system management computers, such as file system management computer 404. Also, in one or more of the various embodiments, file systems, such as file system 402 may include one or more file system objects, such as file system object 406. In one or more of the various embodiments, file system object 406 may be considered to represent the various file system objects, documents objects, or the like, that may be stored in file system 402. In some embodiments, file system objects may include, files, documents, directories, folders, backups, snapshots, replication snapshots, replication information, or the like. In some embodiments, some file system objects may be comprised of smaller file system objects. Accordingly, in some embodiments, blocks or data blocks may be considered to be smallest file system objects that comprise other more complex file system objects, such as, files, documents, or the like.

In one or more of the various embodiments, the implementation details that enable file system 402 to provide file system services may be hidden from clients, such that they may be arranged to use file system 402 the same way they use other conventional local or remote file systems. Accordingly, in one or more of the various embodiments, clients may be unaware that they are using a distributed file system that supports replicating files in distributed file systems using object-based data storage because file system engines or replication engines may be arranged to mimic the interface or behavior of one or more conventional file systems.

Also, while file system 402 is illustrated as using one file system management computer with one set of file system objects, these innovations are not so limited. Innovations herein contemplate file systems that may include one or more file system management computers or one or more file system object data stores. In some embodiments, file system objects may be located remotely from one or more file system management computers. Also, a logical file system object store or file system may be spread across two or more cloud computing environments, storage clusters, or the like.

In one or more of the various embodiments, one or more file system objects may be selectively implemented using write-ahead logs. Likewise, in some embodiments, file system engines may be arranged to employ WALs or other similar data structures for recording meta-data changes, configuration changes, or the like, associated with the operation or management of file systems.

Figure 5:
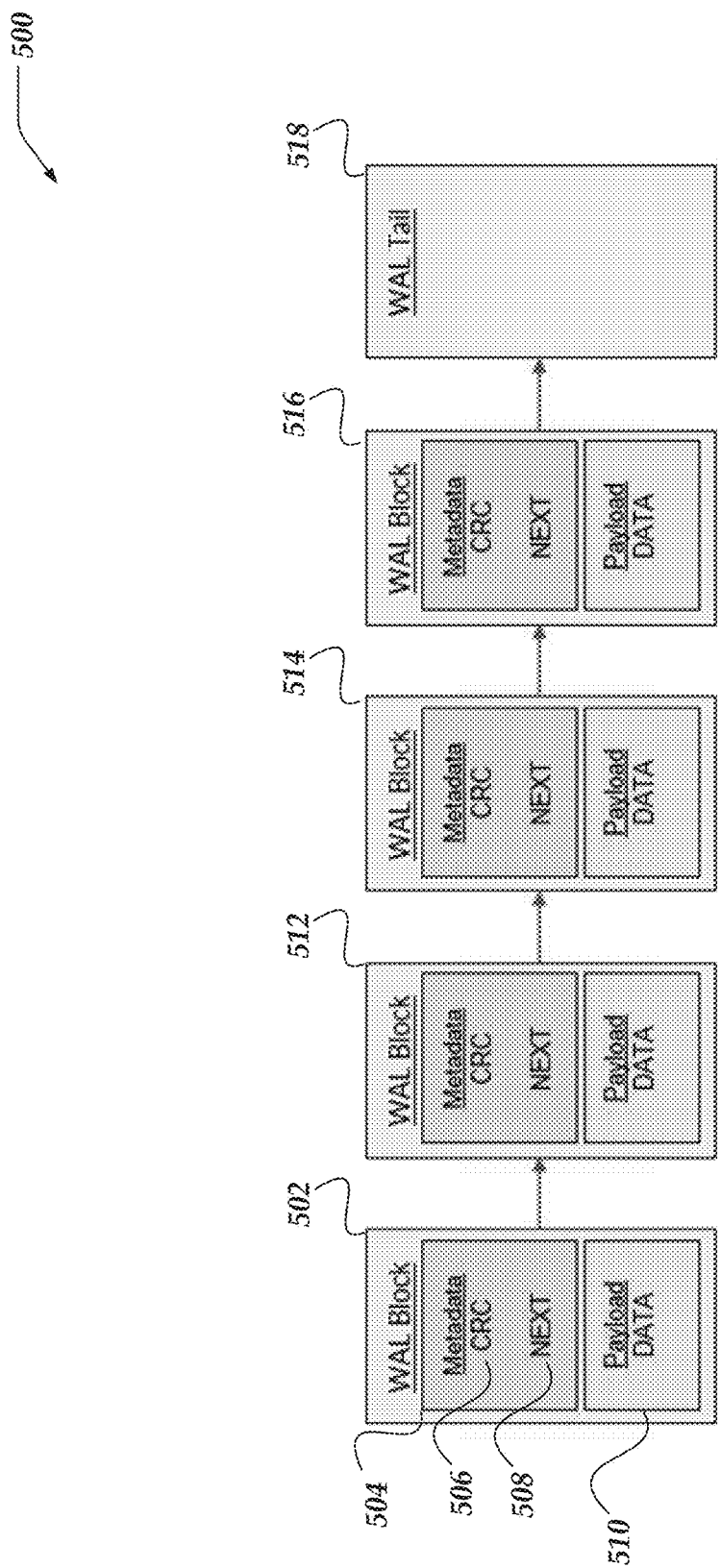
FIG. 5 illustrates a logical schematic of a portion of a write-ahead log that may be employed in some file systems.

FIG. 5 illustrates a logical schematic of a portions of write-ahead log 500 that may be employed in some file systems. In this example, WAL 500 may comprise several blocks, such as, block 502, block 512, block 514, block 516, and tail block 518. In this example, blocks may be considered to locations on a storage device where data may be atomically manipulated. In this example, a portion of each block may be reserved for two or more fields of meta-data that may be employed to managed the WAL. Also, in this example, a portion of each block may be reserved for payload data. In this example, meta-data 504 includes CRC (cyclic redundancy check) field 506 and NEXT field 508. CRC field 506 may represent a digital signature generated based on the entire contents of block 502. NEXT field 508 stores a location of the next block that comprises the WAL. Accordingly, in this example, WALs, such as, WAL 500 may be read (or otherwise traversed) by reading in a first block and then using the location in the NEXT field to locate the next block for the WAL.

Also, in this example, file system engines may be arranged to employ the CRC field to verified that a WAL block is not corrupted or damaged. For example, WAL blocks may be verified by generating a CRC based on the visited WAL block and comparing the generated CRC to the CRC value stored in the CRC field. If the computed CRC matches the CRC in stored in the CRC field, the WAL block may be considered verified.

In some cases, storage devices may corrupt WALs by erroneously overwrite one WAL block with another WAL block. For example, if WAL block 516 is erroneously overwritten onto WAL block, the WAL may be corrupted. However, because the CRC field in a misplaced block will be correct for the misplaced block, misplaced blocks may be determined to be verified even though the WAL itself has been corrupted by the misplaced block.

Figure 6:
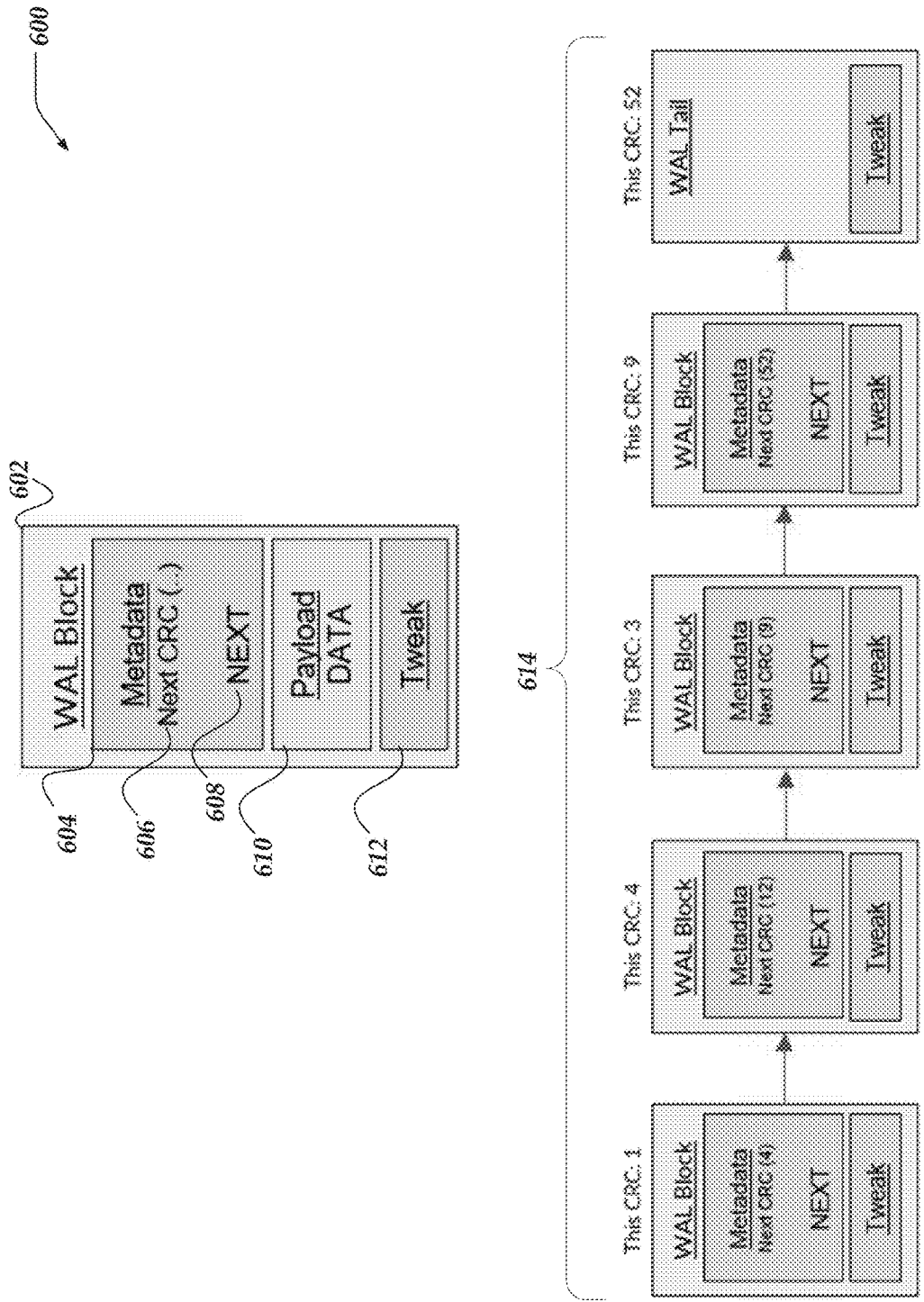
FIG. 6 illustrates a logical schematic of a write-ahead log or error resistant write-ahead logging in accordance with one or more of the various embodiments.

FIG. 6 illustrates a logical schematic of write-ahead log 600 for error resistant write-ahead logging in accordance with one or more of the various embodiments. In one or more of the various embodiments, write-ahead logs may be arranged to include blocks, such as, block 602 rather than blocks, such as, block 502 described above. In some embodiments, block 602 may be arranged to include meta-data 604, payload 610, tweak information 612, or the like.

In one or more of the various embodiments, meta-data may be arranged to include two or more fields, such as, Next CRC field 606, NEXT field 608, or the like. In some embodiments, Next CRC fields, such as, Next CRC field 606 may store a CRC value for the next block that comprises a write-ahead log rather than a CRC for the instant block as does CRC field 506.

In one or more of the various embodiments, blocks may be arranged to include a payload portion, such as, payload 610 for storing the payload data included in the block.

Further, in some embodiments, tweak information 612 may be included in a block to enable write-ahead engines store information that may be used to conform a block to a specified CRC value.

In one or more of the various embodiments, write-ahead log portion 614 represents how a plurality of blocks, such as, block 602, or the like, may be assembled into a write-ahead log. Note, write-ahead log portion 614 may appear similar to write-ahead log 500 described above, however, the meta-data portion of each block store a CRC value for the next block in the write-ahead log rather than the CRC value of the block itself.

Figure 7A:
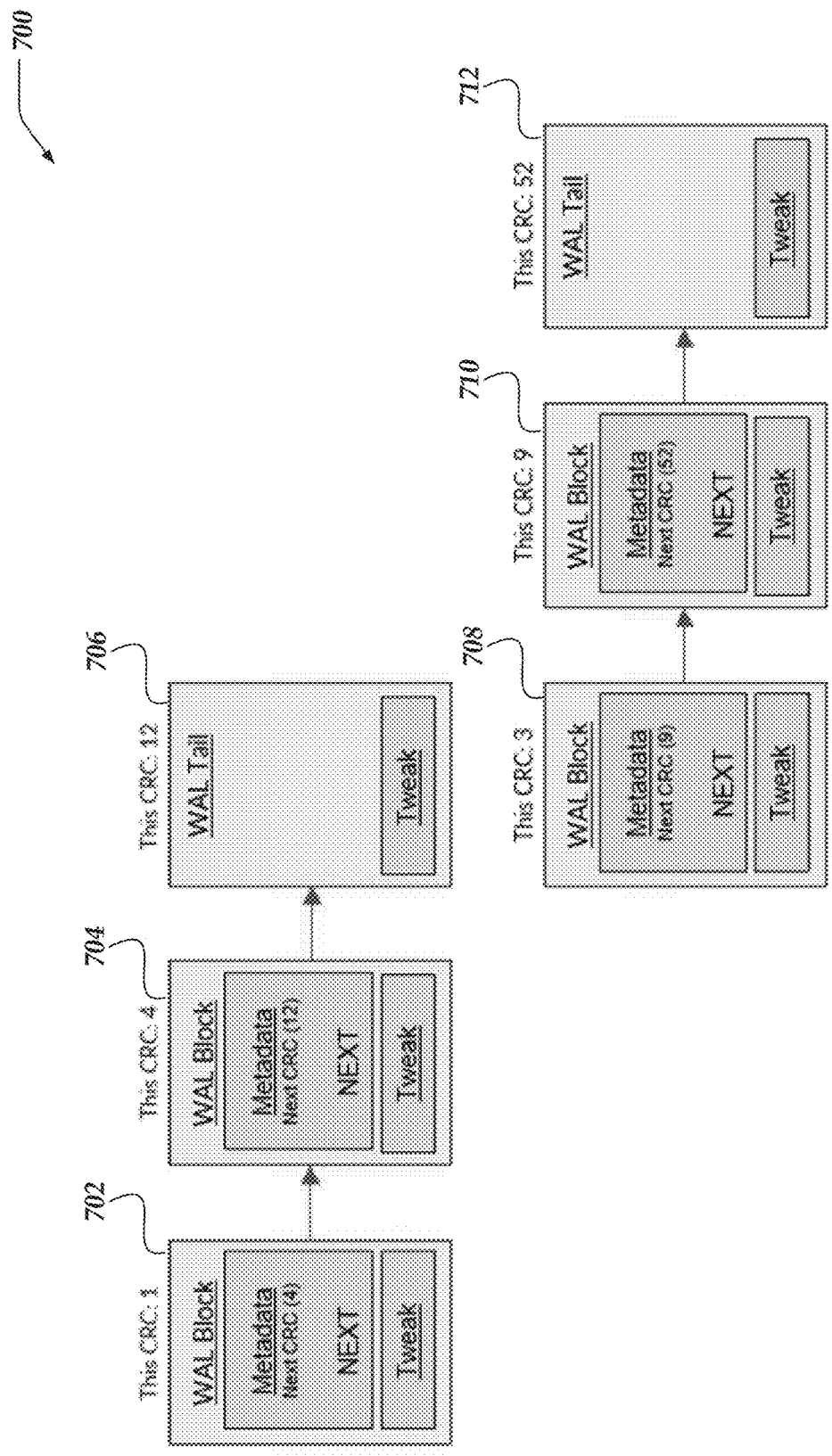
FIG. 7A illustrates a logical schematic of a write-ahead log for appending additional log portions for error resistant write-ahead logging in accordance with one or more of the various embodiments.

FIG. 7A illustrates a logical schematic of write-ahead log 700 for appending additional log portions for error resistant write-ahead logging in accordance with one or more of the various embodiments.

In this example, for some embodiments, block 702, block 704, and block 706 represent a portion of a write-ahead log. While, in this example, block 708, block 710, and block 712 represent logged information that may about to be appended to the write-ahead log. In this example, for some embodiments, block 702, block 704, and block 706 may represent write-ahead log blocks that may be considered stable and persisted in the file system. In contrast, in this example, block 708, block 710, and block 712 may be considered logging information for a file system operation that has yet to be persisted. For example, if a user writes data to the file system, a log segment that provides temporary storage if logging information that corresponds to the user's write may be generated by the file system engine. Accordingly, in some embodiments, if the log segment may be successfully appended to the write-ahead log, the user operation may be considered completed—with the file system engine returning a non-error return value, or the like, to the user to indicate that the actions were completed.

In this example, block 706 may be considered the tail block (e.g., the current end) of the write-ahead log. And, in this example, block 708 may be considered the head block of a log segment that corresponds to a new portion of log information generated in response to one or more file system operations.

Accordingly, in some embodiments, write-ahead engines may be arranged to append the log segment to the existing write-ahead log by appending the log blocks in the log segment to the write-ahead log block list.

In some embodiments, write-ahead engines may be arranged to copy the data from block 708 over the location with the current tail block (block 706) is located. In some embodiments, this first actions avoids a requirement to modify the NEXT pointer in block 704. However, in this example, block 704 includes a NEXT CRC field with a value that matched CRC of the tail block (block 706) that being overwritten. Accordingly, in some embodiments, write-ahead engines may be arranged to modify the tweak data of block 708 to enable its CRC to match the NEXT CRC value included in block 704. Thus, in some embodiments, the CRC of block 704 and NEXT CRC field of block 704 may remained unchanged and correct. Also, in some embodiments, log portions that may be upstream of block 704 may be unaffected by the append operation. In contrast, if the NEXT CRC field value was modified in append target block (e.g., block 704) it would modify the CRC of a the append target block and file systems would need to update all of the upstream blocks in the log file to propagate the CRC changes introduced by the append.

In some embodiments, write-ahead engines may be arranged to perform one or more actions to determine a value for a block's tweak data that results in it a block having a particular CRC value to match the NEXT CRC field of its new upstream block. In some embodiments, write-ahead engines may be arranged to determine the particular CRC matching method based on rules, instructions, libraries, plug-ins, or the like, that may be provided via configuration information to account for local requirements or local circumstances. For example, in some embodiments, if an improved or otherwise more advantageous method for computing the tweak data values to match a given value may be discovered, users or administrators may update rules or instructions in configuration information to implement the new methods.

Further, in one or more of the various embodiments, the size of the tweak data in a block may vary depending on the method used to fix-up a block to keep the value of its CRC unchanged.

Figure 7B:
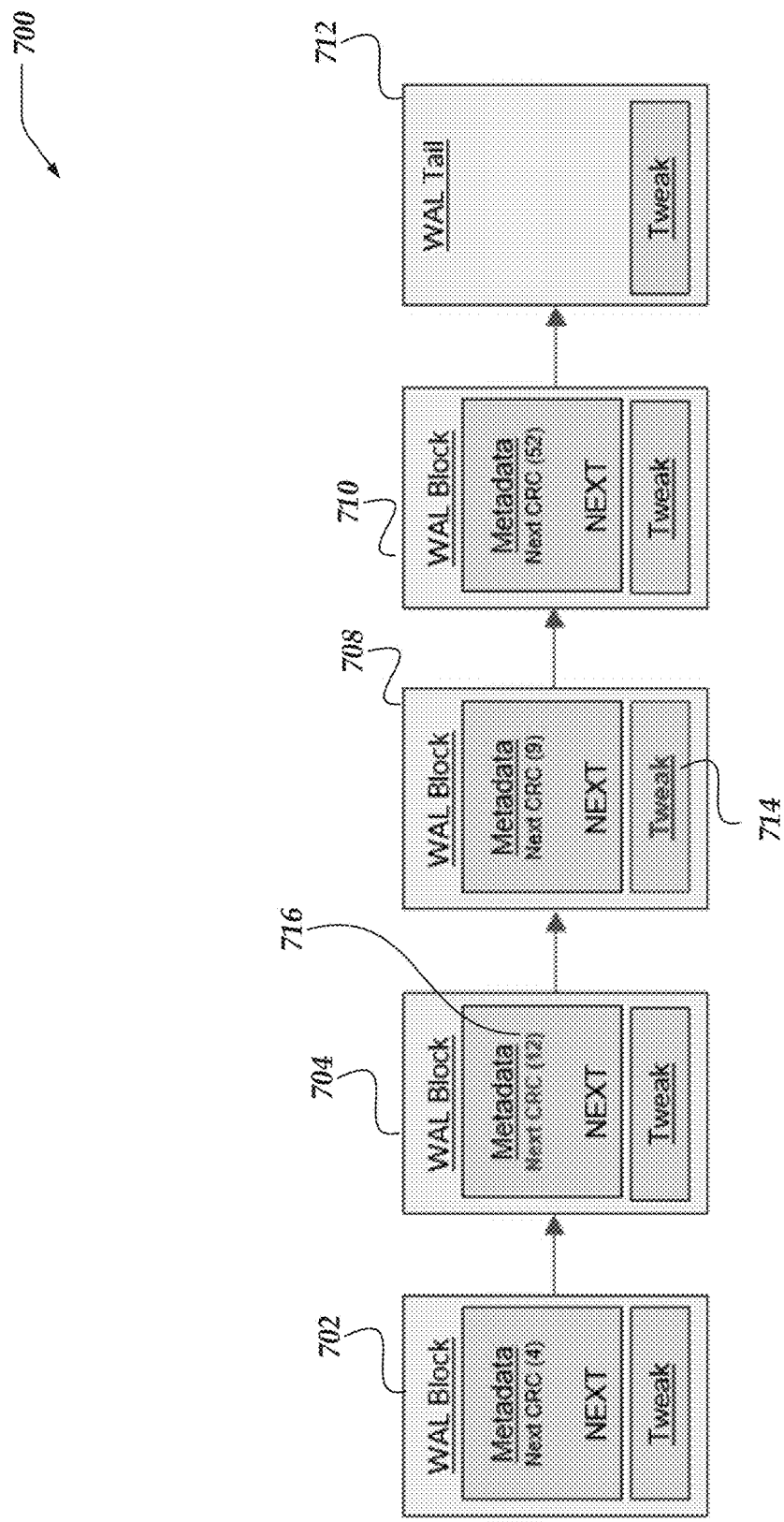
FIG. 7B illustrates a logical schematic of a write-ahead log for appending additional log portions for error resistant write-ahead logging in accordance with one or more of the various embodiments.

FIG. 7B illustrates a logical schematic of write-ahead log 700 for appending additional log portions for error resistant write-ahead logging in accordance with one or more of the various embodiments. In this example, write-ahead log 700 is illustrated as having completed the appending of block 708, block 710, and block 712 to the write log. Accordingly, in this example, for some embodiments, block 712 becomes the tail block for log 700 and the prior tail block (e.g., block 706 in FIG. 7A) has replaced the head block of the appended portion, block 708.

Accordingly, in this example, the write-ahead engine has modified tweak data 714 of block 708 so its CRC value matches the CRC value of the prior tail block (block 706 in FIG. 7A). Thus, in this example, the NEXT CRC field in block 704 remains unchanged. Note, since the memory/storage location previously used by block 706 has be used to store block 708, the NEXT pointer field in block 704 may remain unchanged. And it follows that the append operation did not change the CRC for block 704 so block 704 and upstream blocks may remain intact and untouched.

As a result, in some embodiments, the data consistency/correctness of the log file may be tested/confirmed by confirming that the NEXT CRC value matches the next block in the log file. Accordingly, in some embodiments, system errors that result in a block being written to incorrect location may be discovered. In contrast, in some cases, conventional write-ahead logs schemes may provide reliable methods to ensure the data in a given block is correct by comparing its computed CRC to a CRC value stored in the block, such schemes may be disadvantageous for verifying that blocks in log are in the correct order. Likewise, in some cases, conventional system may also be disadvantageous for determining if blocks are missing or overwritten by other blocks.

Figure 7C:
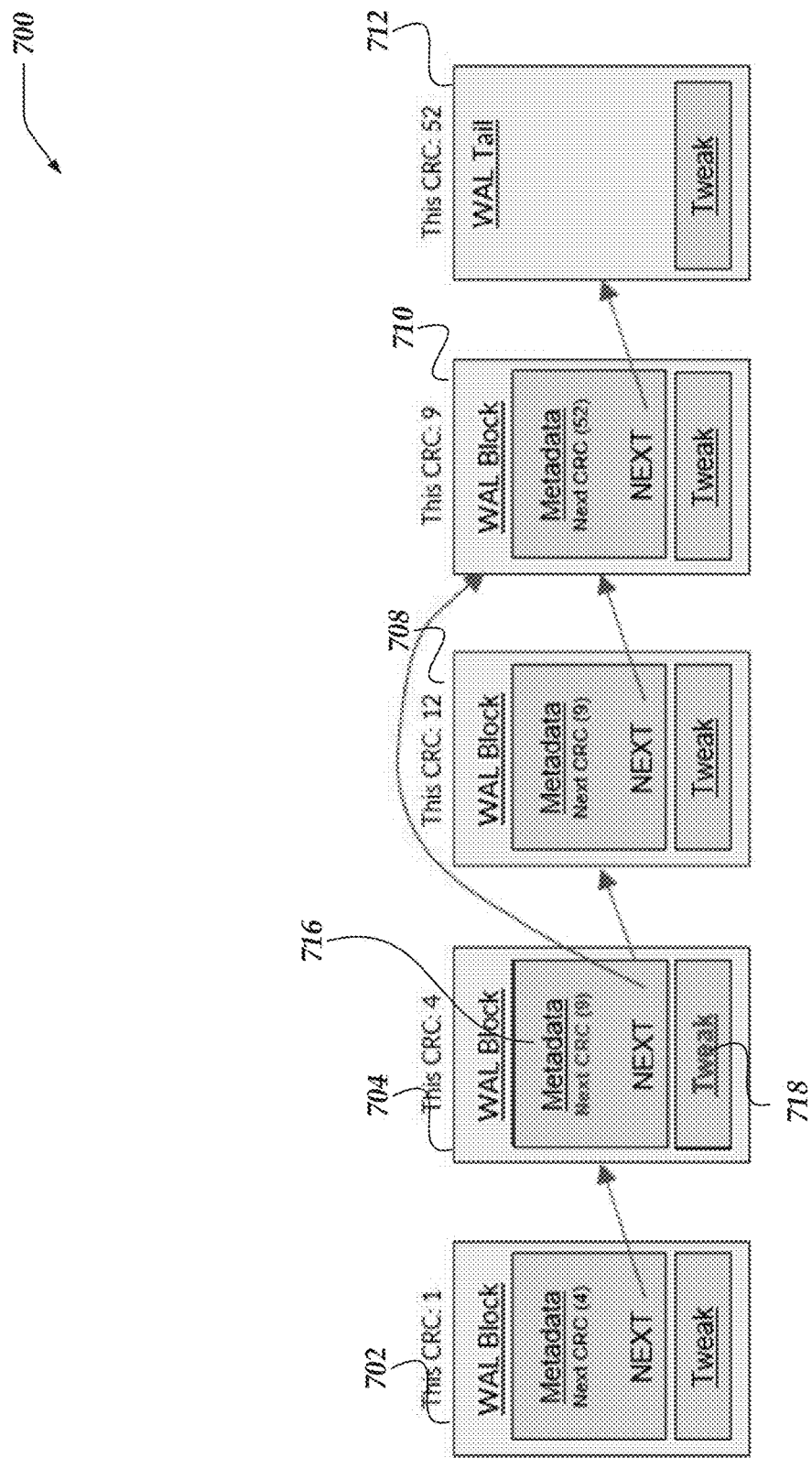
FIG. 7C illustrates a logical schematic of a write-ahead log for removing a log portion for error resistant write-ahead logging in accordance with one or more of the various embodiments.

FIG. 7C illustrates a logical schematic of write-ahead log 700 for removing a log portion for error resistant write-ahead logging in accordance with one or more of the various embodiments. In some cases, for some embodiments, users (or file system engines) may be required to remove one or more blocks from a write-ahead log.

In some embodiments, write-ahead engines may be arranged to determine a head block of a portion of blocks in a write-ahead log that may be removed. In this example, shows how block 708 may be removed from log 700 in accordance with one or more of the various embodiments. In some embodiments, if a first or head block of the removable portion of the log may be determined, write-ahead engines may be arranged to determine the immediate previous block in the log and the block that may be immediately after the removable portion of the log. In this example, because block 708 may be removed, block 704 may be considered the block that is immediate previous to the log portion being removed. And, in this example, block 710 may be considered the block that is immediately after the log portion being removed.

In one or more of the various embodiments, write-ahead engines may be arranged to determine a CRC value for block 710 (9 in this example) and store the CRC value in the NEXT CRC field of block 704. Further, in some embodiments, the NEXT pointer of block 704 may be updated to point to block 710. Thus, in some embodiments, block 708 may be considered to be removed from the log because it may be disconnected from the write-ahead log.

Also, in some embodiments, write-ahead engines may be arranged to determine tweak data for block 704 to enable the CRC value of block 704 to remain unchanged. Otherwise, in this example, the CRC value for block 704 may change because the metadata included in block 704 may be changed by storing the CRC value for block 710 in its NEXT CRC field and by changing the value of its NEXT pointer field to reference block 710. Accordingly, in some embodiments, write-ahead engines may be arranged to determine the tweak data that enables the block immediately in-front of the removable log portion to keep the same CRC value as it had be the removable log portion is removed from the write-ahead log.

Note, in some embodiments, the removed portion may be deleted, discarded, included another log, archived, or the like, depending on the reason or application associated with a block removal operation.

Figure 8:
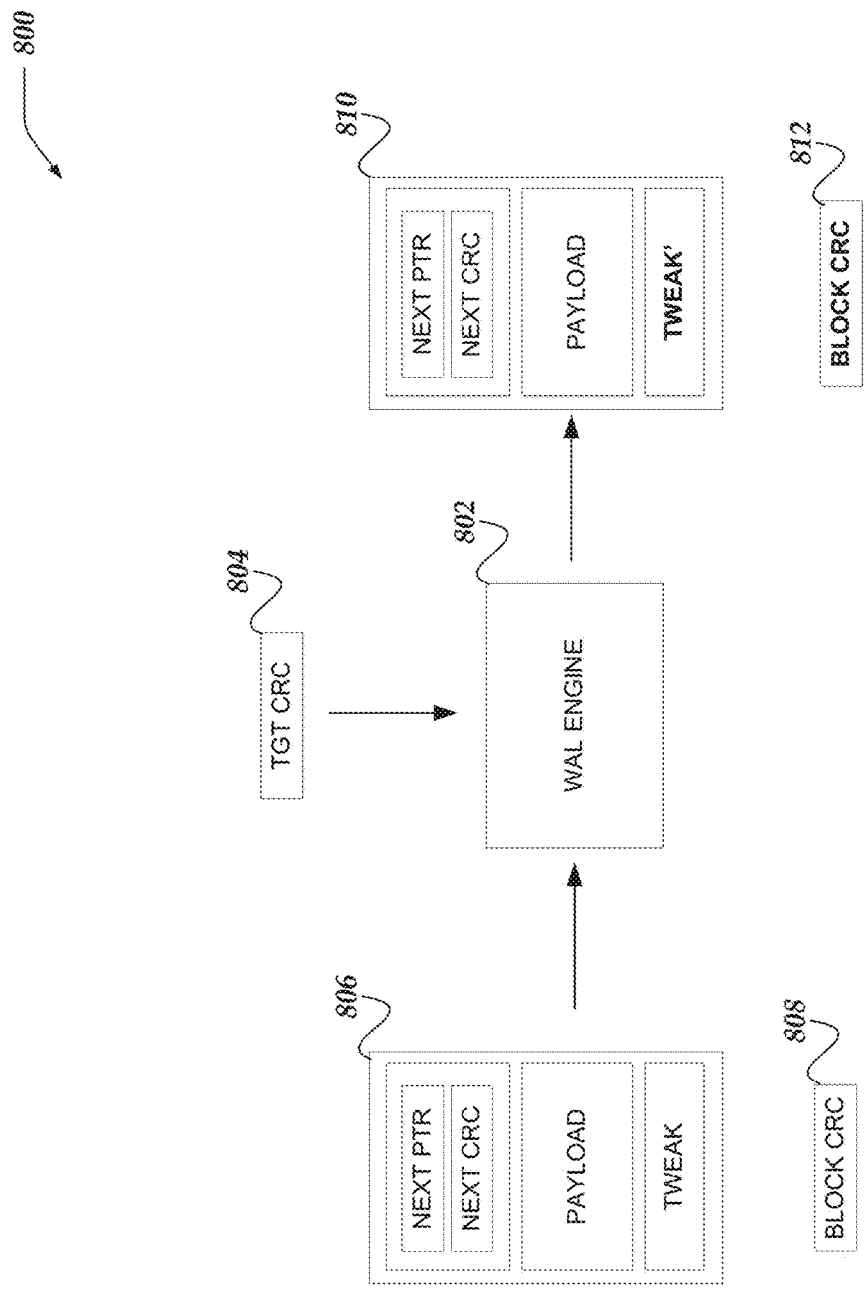
FIG. 8 illustrates a logical schematic for a system for error resistant write-ahead logging in accordance with one or more of the various embodiments.

FIG. 8 illustrates a logical schematic for system 800 for error resistant write-ahead logging in accordance with one or more of the various embodiments. In some embodiments, systems, such as, system 800 may include a write-ahead log engine, such as, write-ahead log engine 802. Accordingly, in some embodiments, a target CRC value, such as, target CRC value 804 and an input block, such as, block 806 may be provided to write-ahead log engine 802.

Accordingly, in some embodiments, write-ahead log engines may be arranged to compute data values that may be included in a tweak data field to enable the CRC value for the modified block to match the target CRC value. In this example, for some embodiments, block 810 may represent a block that has had its tweak data updated such that the block 810 has a CRC value that matches the target CRC value.

In one or more of the various embodiments, one or more characteristics of the CRC method may influence how tweak data may be determined. Also, in some embodiments, one or more other considerations, such as, performance, intellectual property rights (e.g., a particular CRC tweak method may be unavailable because of patent exclusivity, licensing restrictions, or the like.), user/organization preferences, or the like. Accordingly, in some embodiments, write-ahead log engines may be arranged to employ rules, instructions, libraries, plug-ins, extensions, or the like, provided via configuration information to determine the particular tweak method, CRC function, or the like, to account for local requirements or local circumstances.

FIG. 9 illustrate a portion of computer readable instructions 900 for error resistant write-ahead logging in accordance with one or more of the various embodiments. As described above, in some embodiments, write-ahead log engines may be arranged to computer tweak data for a block that enables the blocks overall CRC value to match a target CRC value.

Accordingly, in some embodiments, write-ahead log engines may be provided a CRC value computed from a log block and a and a target CRC value. In some embodiments, write-ahead log engines may be arranged to compute a four byte modifier that may be added into the final four bytes of the block (Tweak data) such that the new CRC value for the log block matches the target CRC value.

One of ordinary skill in the art will appreciate that there may be more than one applicable method for determining tweak data to match enable a CRC for a block to match a target CRC value. However, for brevity and clarity a simplified proof, using quotient ring properties and Galois field arithmetic is included here:

P(x)=crc polynomial, a 33 bit polynomial, stored as 32 bits, with an implicit x^32 field for the 33rd bit modifier=same size as the polynomial 32 bits crc=a function for computing a CRC for a chunk of data.

$$crc(\text{log block data}+\text{modifier})=\text{target CRC value}$$
$$crc(\text{log block data})+crc(\text{modifier})=\text{target CRC}$$
$$\text{value } crc(\text{log block data})+x^{\wedge}32*\text{modifier mod}$$
$$P(x)=\text{target CRC value } crc(\text{log block data})+$$
$$\text{target CRC value}=x^{\wedge}32*\text{modifier mod } P(x) \text{ mul-}$$
$$\text{tiplicative\_inverse}(x^{\wedge}(32))*(crc(\text{log block data})+$$
$$\text{target CRC value})=\text{modifier mod } P(x)=\text{modifier}$$

Also, in this example, for some embodiments, the function named crc32_compute_modifier_asm in FIG. 9 is an example of x86, or x86-like assembly code that implements a method for determining the tweak data to match a target CRC value.

Generalized Operations

FIGS. 10-13 represent generalized operations for error resistant write-ahead logging in accordance with one or more of the various embodiments. In one or more of the various embodiments, processes 1000, 1100, 1200, and 1300 described in conjunction with FIGS. 10-13 may be implemented by or executed by one or more processors on a single network computer, such as network computer 300 of FIG. 3. In other embodiments, these processes, or portions thereof, may be implemented by or executed on a plurality of network computers, such as network computer 300 of FIG. 3. In yet other embodiments, these processes, or portions thereof, may be implemented by or executed on one or more virtualized computers, such as, those in a cloud-based environment. However, embodiments are not so limited and various combinations of network computers, client computers, or the like may be utilized. Further, in one or more of the various embodiments, the processes described in conjunction with FIGS. 10-13 may perform actions for error resistant write-ahead log in accordance with at least one of the various embodiments or architectures such as those described in conjunction with FIGS. 4-9. Further, in one or more of the various embodiments, some or all of the actions performed by processes 1000, 1100, 1200, and 1300 may be executed in part by file system engine 322, WAL engine 324, or the like.

Figure 10:
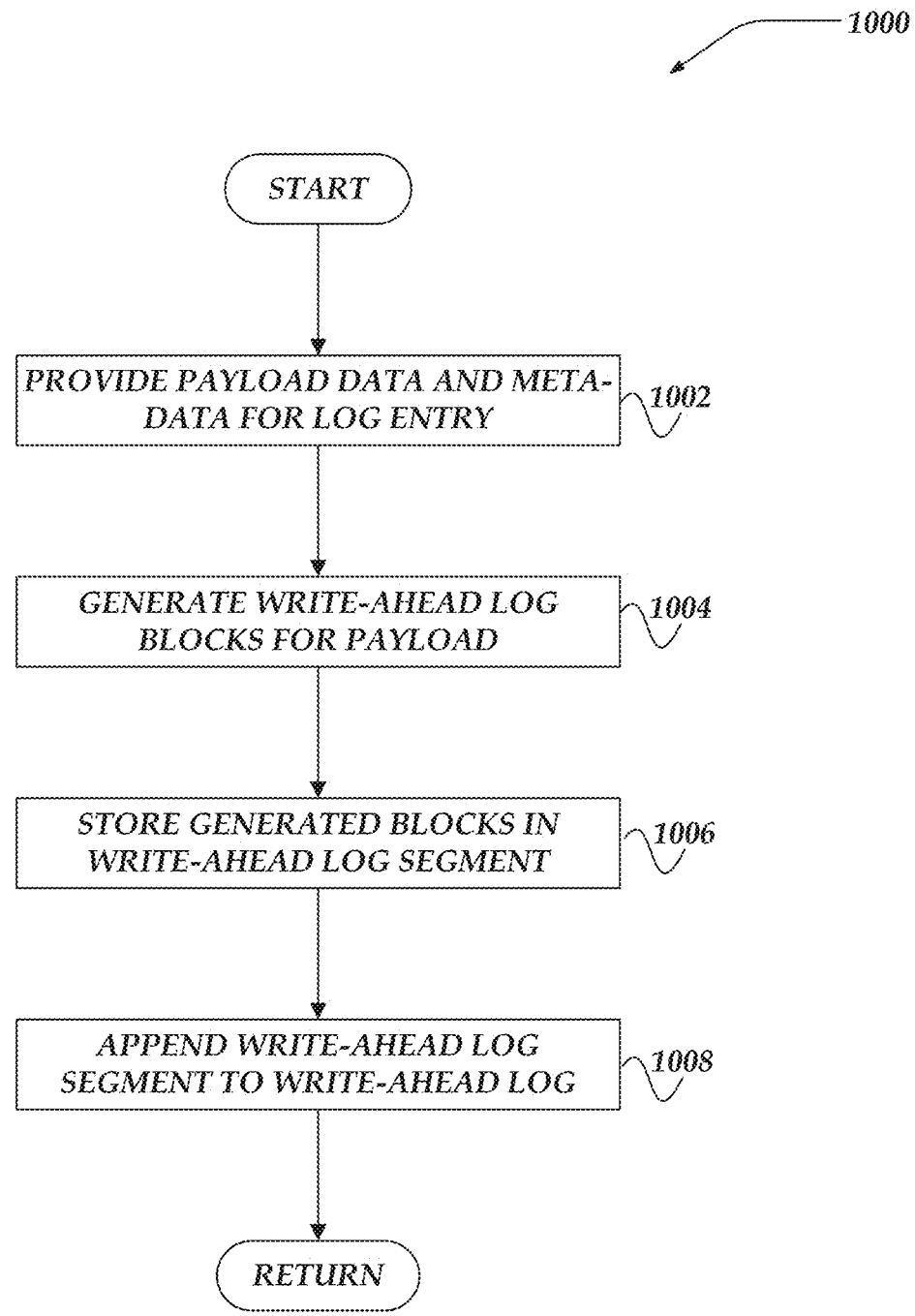
FIG. 10 illustrates an overview flowchart for a process for an error resistant write-ahead log in accordance with one or more of the various embodiments.

FIG. 10 illustrates an overview flowchart for process 1000 for an error resistant write-ahead log in accordance with one or more of the various embodiments. After a start block, at flowchart block 1002, in one or more of the various embodiments, write-ahead log engines may be provided payload data and meta-data for a log entry. At block 1004, in one or more of the various embodiments, write-ahead log engines may be arranged to generate one or more write-ahead blocks to accommodate the payload that may require logging. At block 1006, in one or more of the various embodiments, write-ahead log engines may be arranged to store the generated write-ahead block in a log segment. At block 1008, in one or more of the various embodiments, write-ahead log engines may be arranged to perform one or more actions to append the log segment to the write-ahead log. Next, in one or more of the various embodiments, control may be returned to a calling process.

Figure 11:
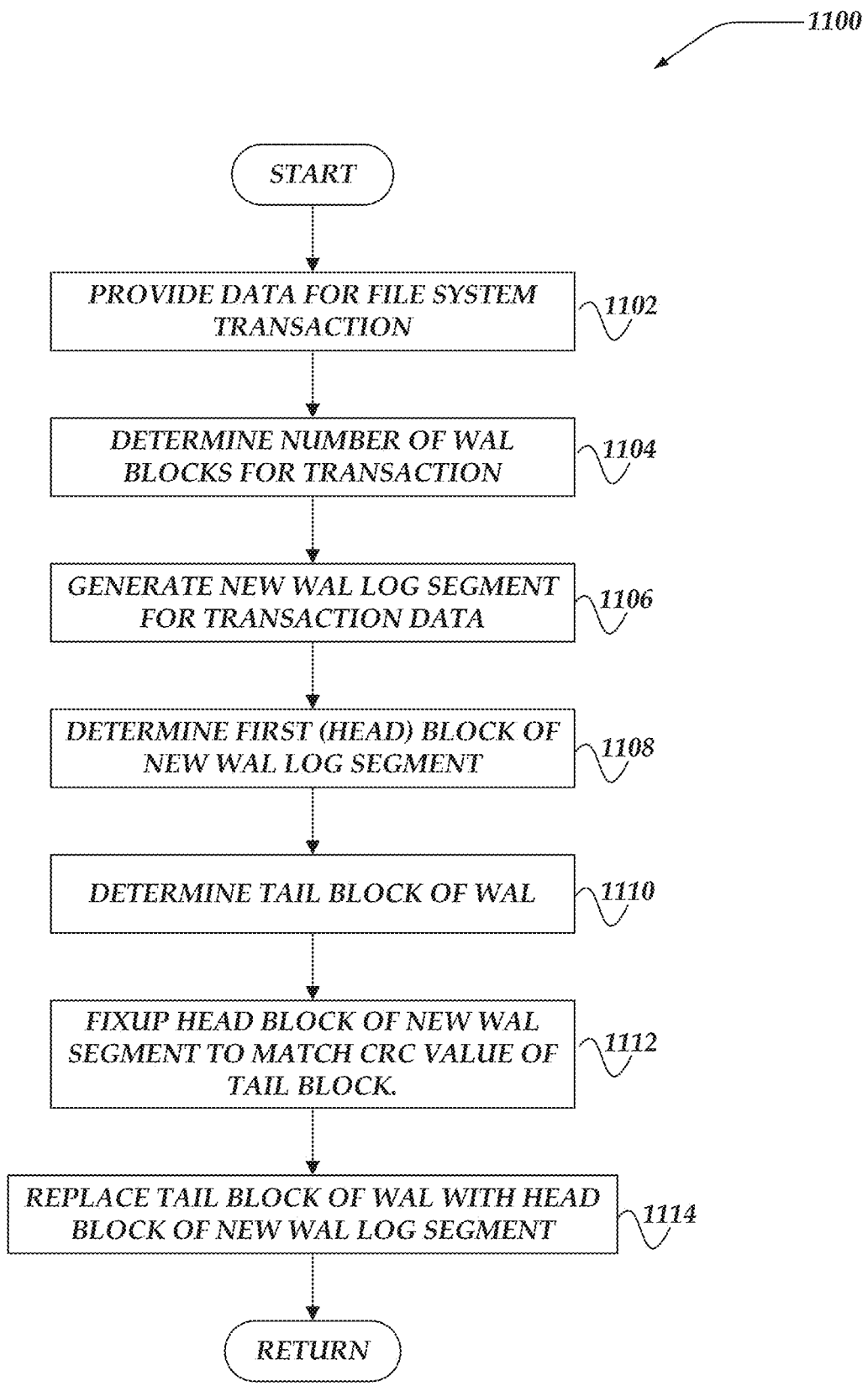
FIG. 11 illustrates a flowchart for a process for an error resistant write-ahead log in accordance with one or more of the various embodiments.

FIG. 11 illustrates a flowchart for process 1100 for an error resistant write-ahead log in accordance with one or more of the various embodiments. After a start block, at flowchart block 1102, in one or more of the various embodiments, data associated with a file system transaction may be provided to a write-ahead log engine for writing to a write-ahead log. As described above, in some embodiments, file systems may employ one or more write-ahead logs to record/track changes to configurations settings, record/preserve changes to one or more file system objects, or the like. Accordingly, in some embodiments, file systems may be arranged to associate one or more particular file system actions/commands with particular write-ahead logs.

In one or more of the various embodiments, file system clients may provide one or more commands (with or without data) that may require one or more write-ahead log blocks to be appended to a write-ahead log.

At flowchart block 1104, in one or more of the various embodiments, write-ahead log engines may be arranged to determine the number of write-ahead log blocks for that may be sufficient for logging the file system transaction. As described above, in some embodiments, write-ahead log block data structure may be arranged to have a pre-determined size. In some cases, the size of blocks may be determined based on one or more characteristics of the underlying data storage devices/technology and the write-ahead log application. For example, in some cases, storage devices may guarantee atomic operations for a limited set of block sizes. Accordingly, in some embodiments, if employing atomic operations to establish a write-ahead log may be advantageous for a given application, the size of write-ahead log blocks may be limited to data sizes that may be atomically processed by the relevant storage devices.

At block 1106, in one or more of the various embodiments, write-ahead log engines may be arranged to generate a new write-ahead log segment based on the data associated with the file system transaction. In some cases, the file system operation that may trigger a write-ahead log event may be associated with more data than can fit in a single write-ahead log block. Accordingly, in some embodiments, write-ahead log engines may be arranged to determine a number of write-ahead log blocks for an operation based on comparing the payload capacity of a write-ahead log block with the data that represents the file system transaction. Also, in some embodiments, write-ahead log engines may be arranged to consider meta-data size as if determining the number of write-ahead log blocks for a transaction. For example, for some embodiments, if a write-ahead log block size is four kilobytes with three kilobytes reserved for payload data and one kilobytes are reserved for meta-data and tweak data, a file system operation that results in saving twelve kilobytes of payload data to a write-ahead log would require at least four write-ahead log blocks.

Accordingly, in some embodiments, write-ahead log engines may be arranged to generate a write-ahead log segment that comprises the write-ahead log blocks required for supporting each file system transaction. In some embodiments, write-ahead log segments may be linked together in order similar to how write-ahead logs may be arranged. Thus, in some embodiments, blocks in log segments may be linked by NEXT pointers and they may include NEXT CRC fields that store the CRC value for adjacent downstream blocks.

In some embodiments, write-ahead log segments may be considered ephemeral or otherwise non-persistent. In some embodiments, write-ahead log segments may be stored in memory, caches, on storage devices, or the like, until they may be written to a write-ahead log.

At block 1108, in one or more of the various embodiments, write-ahead log engines may be arranged determine a first (head) block in the new write-ahead log segment. In some embodiments, if the head block may be determined the rest of the blocks in a log segment may be determined by traversing the segment via the NEXT pointers included in the meta-data of each block in the segment.

At flowchart block 1110, in one or more of the various embodiments, write-ahead log engines may be arranged to determine the current tail block of the write-ahead log. As described above, in some embodiments, write-ahead logs may be configured to have a terminal block that may be designated as the tail block. In some embodiments, the location/storage space allocated to the tail block may be overwritten during append operations. Accordingly, in some embodiments, tail blocks may omit actual payload data or meta-data associated with actual file system operations. In some embodiments, tail block may be designated in part by setting the NEXT point value to a null value representing that the tail block is the terminal block in the sequence of write-ahead log blocks.

At block 1112, in one or more of the various embodiments, write-ahead log engines may be arranged to perform one or more actions to fix-up the head block of the new write-ahead log segment to match the CRC value of the current tail block of the write-ahead log.

As described above, in some embodiments, in an append operation the head block of the log segment being appended may be copied into the location of the current tail block of the write-ahead log. Accordingly, in some embodiments, the block immediately upstream of the write-ahead log tail block may include a NEXT pointer that references that location and a NEXT CRC field that is storing the CRC value of the former tail block. Accordingly, in some embodiments, write-ahead log engines may be arranged to determine the tweak data that enables the CRC of the head block data that replaces the tail block to match the CRC of the former tail block of the write-ahead log. Thus, in some embodiments, the block at the append point in write-ahead log may remain unmodified. Otherwise, if the block at the append point is modified, it may require all block upstream of the append point block to be modified in turn to fix-up there NEXT CRC fields.

At block 1114, in one or more of the various embodiments, write-ahead log engines may be arranged to replace the tail block of the write-ahead log with the head block of the new write-ahead log segment. In one or more of the various embodiments, write-ahead log engines copy the tweaked head block to the same location as the soon-to-be former tail block.

Next, in one or more of the various embodiments, control may be returned to a calling process.

Figure 12:
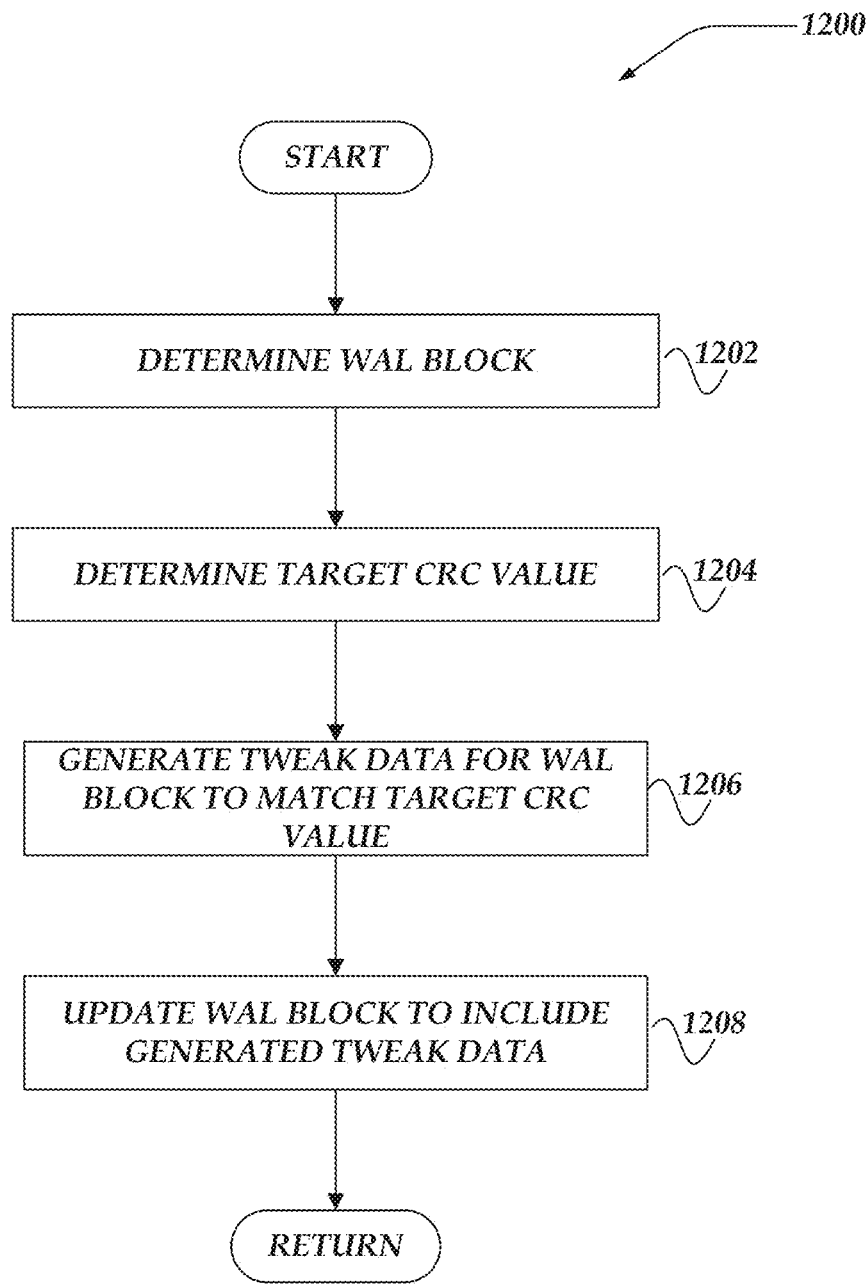
FIG. 12 illustrates a flowchart for a process for CRC target matching for an error resistant write-ahead log in accordance with one or more of the various embodiments.

FIG. 12 illustrates a flowchart for process 1200 for CRC target matching for error resistant write-ahead logging in accordance with one or more of the various embodiments. As described above, in some embodiments, in various circumstances, including, adding one or more blocks to a write-ahead log, removing blocks from a write-ahead log, or the like, one or more write-ahead log blocks may be modified to ensure that the block's CRC matches a target CRC. After a start block, at flowchart block 1202, in one or more of the various embodiments, write-ahead log engines may be arranged to determine a write-ahead log block. As described above, in some embodiments, write-ahead log blocks may include meta-data, payload data, and tweak data. Accordingly, in some embodiments, the meta-data and payload data of the determined write-ahead log block may be considered to be a final state. For example, in some embodiments, the NEXT pointer or NEXT CRC field of the block may be updated to support write-ahead log operations, such as, appending or removing blocks.

In some embodiments, note, if a CRC for the block may be generated, the CRC will be based on the meta-data, payload, and tweak data included in the block.

At flowchart block 1204, in one or more of the various embodiments, write-ahead log engines may be arranged to determine a target CRC value. As described above, target CRCs may often be a CRC value that be another block in a write-ahead log may reference. For example, in some embodiments, during an append operation, write-ahead log engines may be arranged to ensure that the head block of the appended log segment has a CRC value that matches the NEXT CRC field in the block that may be linked to the new log segment.

At flowchart block 1206, in one or more of the various embodiments, write-ahead log engines may be arranged to generate tweak data for the write-ahead log block to match the target CRC value. As described above, for some embodiments, tweak data may be reserved portion of the write-ahead log block data structure that is directed to storing data in the block that causes the block to have a particular CRC value. Accordingly, in some embodiments, if the tweak data is changed, the CRC value for the corresponding block may be changed as well. Thus, in some embodiments, write-ahead log engines may be arranged to determine the precise tweak data values to ensure a block intentionally has a CRC value that matches a target CRC value.

Accordingly, in some embodiments. write-ahead log engines may be arranged to perform one or more actions to determine that particular tweak data that enables a CRC function applied to the block to produce the target CRC. Thus, in some embodiments, even if the substantive data (e.g., NEXT CRC field, NEXT block pointer, other meta-data, payload data, or the like) of a write-ahead log block has been modified, write-ahead log engines may be arranged to determine tweak data values that result in the CRC for block matching the target CRC. In some embodiments, the particular actions for determining the tweak data that matched the target CRC may vary depending on the particular CRC code (algorithms) being employed. In some cases, considerations, such as, size of the blocks, available tool support, performance requirements, organization preferences, intellectual property/licensing concerns, or the like, may inform one of ordinary skill in the art in determine the how to compute CRCs for a particular application. Accordingly, in some embodiments, write-ahead log engines may be arranged to determine the one or more actions for generating CRCs, generating tweak data, or the like, based on rules, instructions, libraries, plug-ins, extensions, or the like, provided via configuration information to account for local requirements or local circumstances. For example, in some embodiments, if an organization determine of discover that method B produces better results for their application than a current method A, the organization may updated configuration information to enable or update the actions for determining CRCs or determining tweak data.

At flowchart block 1208, in one or more of the various embodiments, write-ahead log engines may be arranged to update the write-ahead log block to include the generated tweak data. In one or more of the various embodiments, if the write-ahead log engines determines tweak data that enables a CRC of the block to match the target CRC, the determined tweak data may included in the block data structure.

Next, in one or more of the various embodiments, control may be returned to a calling process.

Figure 13:
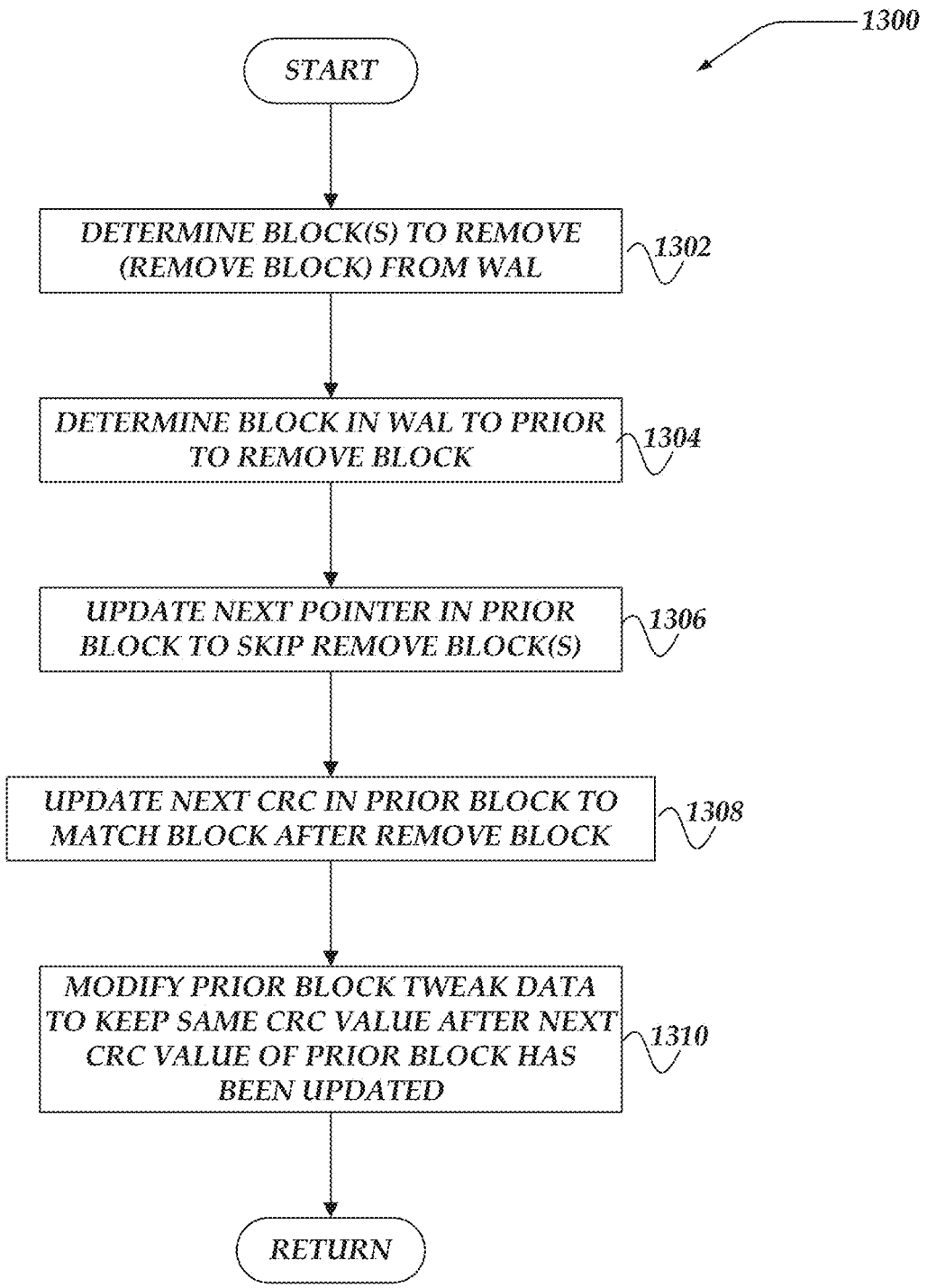
FIG. 13 illustrates a flowchart for a process for CRC target matching for an error resistant write-ahead log in accordance with one or more of the various embodiments.

FIG. 13 illustrates a flowchart for process 1300 for CRC target matching for error resistant write-ahead logging in accordance with one or more of the various embodiments. After a start block, at flowchart block 1302, in one or more of the various embodiments, write-ahead log engines may be arranged to determine one or more blocks to remove from a write-ahead log. As described above, one or more user actions or file system activity may result in one or more blocks being intentionally removed from a write-ahead log. Accordingly, in some embodiments, write-ahead log engines may be provided a information that enable it to determine the one or more blocks that may be designated for removal. In some embodiments, this information may include an identifier of the first block and last block a log segment designated for removal. Also, in some embodiments, write-ahead log engines may be provided the first block identifier and a count of blocks to remove. Also, in some embodiments, write-ahead log engines may be provided a list or set of block that may be designated for removal. In some embodiments, write-ahead log engines may be arranged to provide one or more APIs that enable various parameter combinations to be provided to enable the determination of the one or more blocks that may be designated for removal.

At flowchart block 1304, in one or more of the various embodiments, write-ahead log engines may be arranged to determine a block in the write-ahead log that may be immediately prior (in-front) to the determined remove blocks. As described above, in some embodiments, removing blocks may require the identifying the blocks in the write-ahead log that link-to/point-to the block(s) being removed from the write-ahead log.

At flowchart block 1306, in one or more of the various embodiments, write-ahead log engines may be arranged to update the NEXT pointer in the prior block to skip over the remove block(s). In some embodiments, removing the blocks designated for removal from the write-ahead log may be accomplished by modifying the NEXT pointer of the block just ahead of the block(s) being removed to point the first remaining block. The pointer may be set to reference the location of the first block in the write-ahead log that comes after the one or more blocks that may be designated for removal.

At flowchart block 1308, in one or more of the various embodiments, write-ahead log engines may be arranged to update the NEXT CRC value in the prior block to match the CRC of the block just after the blocks designated for removal. Similar to modifying the NEXT pointer to point to first remaining block in the write-ahead log, the NEXT CRC field value in the adjacent block that comes before the block(s) that may be designated for removal may be set to the CRC value of the first remaining block in write-ahead log. The NEXT CRC field value may be set to the CRC value of the first block in the write-ahead log that comes after the one or more blocks that may be designated for removal.

At flowchart block 1310, in one or more of the various embodiments, write-ahead log engines may be arranged to modify the prior block tweak data to enable the prior block to keep the same CRC value that it had before its NEXT pointer and NEXT CRC value were updated.

In one or more of the various embodiments, if the NEXT pointer and NEXT CRC field value of the block that comes before the one or more blocks designated for removal may be changed, the CRC of that block may be different before the remove operation started. Accordingly, in some embodiments, the NEXT pointer and NEXT CRC value for the adjacent upstream block may not match the new CRC for the block with the modified NEXT pointer and NEXT CRC field value. Thus, in some embodiments, write-ahead log engines may be arranged to generate tweak data that may be included in that block to ensure that its new CRC value matches its previous CRC value. In some embodiments, enabling the CRC value for the block to remain unchanged may be enable the adjacent upstream blocks to remain unchanged.

Next, in one or more of the various embodiments, control may be returned to a calling process.

It will be understood that each flowchart block in each flowchart illustration, and combinations of flowchart blocks in each flowchart illustration, can be implemented by computer program instructions. These program instructions may be provided to a processor to produce a machine, such that the instructions, which execute on the processor, create means for implementing the actions specified in each flowchart block or flowchart blocks. The computer program instructions may be executed by a processor to cause a series of operational steps to be performed by the processor to produce a computer-implemented process such that the instructions, which execute on the processor, provide steps for implementing the actions specified in each flowchart block or flowchart blocks. The computer program instructions may also cause at least some of the operational steps shown in the flowchart blocks of each flowchart to be performed in parallel. Moreover, some of the steps may also be performed across more than one processor, such as might arise in a multi-processor computer system. In addition, one or more flowchart blocks or combinations of flowchart blocks in each flowchart illustration may also be performed concurrently with other flowchart blocks or combinations of flowchart blocks, or even in a different sequence than illustrated without departing from the scope or spirit of the invention.

Accordingly, each flowchart block in each flowchart illustration supports combinations of means for performing the specified actions, combinations of steps for performing the specified actions and program instruction means for performing the specified actions. It will also be understood that each flowchart block in each flowchart illustration, and combinations of blocks in each flowchart illustration, can be implemented by special purpose hardware based systems, which perform the specified actions or steps, or combinations of special purpose hardware and computer instructions. The foregoing example should not be construed as limiting or exhaustive, but rather, an illustrative use case to show an implementation of at least one of the various embodiments of the invention.

Further, in one or more embodiments (not shown in the figures), the logic in the illustrative flowcharts may be executed using an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. In one or more embodiments, a microcontroller may be arranged to directly execute its own embedded logic to perform actions and access its own internal memory and its own external Input and Output Interfaces (e.g., hardware pins or wireless transceivers) to perform actions, such as System On a Chip (SOC), or the like.

What is claimed as new and desired to be protected by Letters Patent of the united states is:

1. A method for managing data in a file system over a network using one or more processors that execute instructions that are configured to cause actions, comprising:
   generating a write-ahead log (WAL) for preserving a verifiable record of file system activity, wherein the WAL includes a sequence of log blocks that each include a cyclic redundancy check (CRC) value of a next adjacent log block in the WAL and a last log block in the WAL is a tail-block with a placeholder value for a CRC value of its next adjacent log block in the WAL;
   in response to executing a file system operation associated with payload data, performing further actions, including:
      generating one or more log blocks based on the payload data, wherein the one or more log blocks each include a portion of the payload data;
      generating a log segment that includes the one or more log blocks, wherein each log block in the log segment includes a reference to a next adjacent log block in the log segment;
      modifying a portion of the contents of a head-block of the log segment, wherein the modified head-block of the log segment has a CRC value that is modified to match a CRC value of the tail-block of the WAL, wherein the modification prevents one or more CRC errors occurring in the generation of the WAL for the file system activity;
      copying the contents of the modified head-block of the log segment into the tail-block of the WAL; and providing an acknowledgment that the file system operation is executed.

2. The method of claim 1, wherein modifying the portion of the contents of the head-block of the log segment, further comprises:
determining a tweak data field in the head-block of the log segment;
determining a remainder portion of the head-block of the log segment absent the tweak data field;
determining a value for the tweak data field based on a combination of the determined value of the tweak data field in the head-block of the log segment and the remainder portion of the head-block of the log segment, wherein a CRC value for the combination of the determined value of the tweak data field of the head-block of the log segment and the remainder portion of the head-block of the log segment matches the CRC value of the tail-block of the WAL.

3. The method of claim 1, further comprising:
determining a sequence of one or more remove log blocks in the WAL that are designated for removal from the WAL based on another file system operation;
determining a first log block in the WAL that is prior to and adjacent to the sequence of the one or more remove log blocks;
updating a reference in the first log block to point to a second log block in the WAL that is subsequent to and adjacent to the sequence of the one or more remove log blocks;
updating a reference to a next log block in the first log block to point to the second log block;
updating a next log block CRC field in the first log block to match a CRC field in the second log block; and
modifying a value of a tweak data field in the first log block to ensure a CRC field of the first block remains unchanged.

4. The method of claim 1, wherein each log block in the WAL includes, a CRC value of the log block, a CRC value of its next adjacent log block, a tweak data field, and a payload data section.

5. The method of claim 1, wherein copying the contents of the head-block of the log segment into the tail-block of the WAL, further comprises:
determining a location in a random access memory (RAM) that stores the tail-block of the WAL; and
replacing the contents of the tail-block of the WAL with the contents of the head-block of the log segment, wherein the location of the tail-block of the WAL in the RAM remains unchanged.

6. A system for managing data in a file system comprising:
a network computer, comprising:
a non-transitory memory device that stores at least instructions; and
one or more processors that execute the instructions that are configured to cause actions, including:
generating a write-ahead log (WAL) for preserving a verifiable record of file system activity, wherein the WAL includes a sequence of log blocks that each include a cyclic redundancy check (CRC) value of a next adjacent log block in the WAL and a last log block in the WAL is a tail-block with a placeholder value for a CRC value of its next adjacent log block in the WAL;
in response to executing a file system operation associated with payload data, performing further actions, including:
generating one or more log blocks based on the payload data, wherein the one or more log blocks each include a portion of the payload data;
generating a log segment that includes the one or more log blocks, wherein each log block in the log segment includes a reference to a next adjacent log block in the log segment;
modifying a portion of the contents of a head-block of the log segment, wherein the modified head-block of the log segment has a CRC value that is modified to match a CRC value of the tail-block of the WAL, wherein the modification prevents one or more CRC errors occurring in the generation of the WAL for the file system activity;
copying the contents of the modified head-block of the log segment into the tail-block of the WAL; and
providing an acknowledgment that the file system operation is executed; and
one or more client computers, comprising:
a non-transitory memory device that stores at least instructions; and
one or more processors that execute instructions that perform actions, including, providing one or more commands associated with the file system operation.

7. The system of claim 6, wherein modifying the portion of the contents of the head-block of the log segment, further comprises:
determining a tweak data field in the head-block of the log segment;
determining a remainder portion of the head-block of the log segment absent the tweak data field;
determining a value for the tweak data field based on a combination of the determined value of the tweak data field in the head-block of the log segment and the remainder portion of the head-block of the log segment, wherein a CRC value for the combination of the determined value of the tweak data field of the head-block of the log segment and the remainder portion of the head-block of the log segment matches the CRC value of the tail-block of the WAL.

8. The system of claim 6, wherein the one or more network computer processors execute instructions that perform actions, further comprising:
determining a sequence of one or more remove log blocks in the WAL that are designated for removal from the WAL based on another file system operation;
determining a first log block in the WAL that is prior to and adjacent to the sequence of the one or more remove log blocks;
updating a reference in the first log block to point to a second log block in the WAL that is subsequent to and adjacent to the sequence of the one or more remove log blocks;
updating a reference to a next log block in the first log block to point to the second log block;
updating a next log block CRC field in the first log block to match a CRC field in the second log block; and
modifying a value of a tweak data field in the first log block to ensure a CRC field of the first block remains unchanged.

9. The system of claim 6, wherein each log block in the WAL includes, a CRC value of the log block, a CRC value of its next adjacent log block, a tweak data field, and a payload data section.

10. The system of claim 6, wherein copying the contents of the head-block of the log segment into the tail-block of the WAL, further comprises:
 determining a location in a random access memory (RAM) that stores the tail-block of the WAL; and
 replacing the contents of the tail-block of the WAL with the contents of the head-block of the log segment, wherein the location of the tail-block of the WAL in the RAM remains unchanged.

11. A processor readable non-transitory storage media that includes instructions for managing data in a file system over a network, wherein execution of the instructions, by one or more processors on one or more network computers, are configured to cause actions, comprising:
 generating a write-ahead log (WAL) for preserving a verifiable record of file system activity, wherein the WAL includes a sequence of log blocks that each include a cyclic redundancy check (CRC) value of a next adjacent log block in the WAL and a last log block in the WAL is a tail-block with a placeholder value for a CRC value of its next adjacent log block in the WAL;
 in response to executing a file system operation associated with payload data, performing further actions, including:
  generating one or more log blocks based on the payload data, wherein the one or more log blocks each include a portion of the payload data;
  generating a log segment that includes the one or more log blocks, wherein each log block in the log segment includes a reference to a next adjacent log block in the log segment;
  modifying a portion of the contents of a head-block of the log segment, wherein the modified head-block of the log segment has a CRC value that is modified to match a CRC value of the tail-block of the WAL, wherein the modification prevents one or more CRC errors occurring in the generation of the WAL for the file system activity;
  copying the contents of the modified head-block of the log segment into the tail-block of the WAL; and
  providing an acknowledgment that the file system operation is executed.

12. The media of claim 11, wherein modifying the portion of the contents of the head-block of the log segment, further comprises:
 determining a tweak data field in the head-block of the log segment;
 determining a remainder portion of the head-block of the log segment absent the tweak data field;
 determining a value for the tweak data field based on a combination of the determined value of the tweak data field in the head-block of the log segment and the remainder portion of the head-block of the log segment, wherein a CRC value for the combination of the determined value of the tweak data field of the head-block of the log segment and the remainder portion of the head-block of the log segment matches the CRC value of the tail-block of the WAL.

13. The media of claim 11, further comprising:
 determining a sequence of one or more remove log blocks in the WAL that are designated for removal from the WAL based on another file system operation;
 determining a first log block in the WAL that is prior to and adjacent to the sequence of the one or more remove log blocks;
 updating a reference in the first log block to point to a second log block in the WAL that is subsequent to and adjacent to the sequence of the one or more remove log blocks;
 updating a reference to a next log block in the first log block to point to the second log block;
 updating a next log block CRC field in the first log block to match a CRC field in the second log block; and
 modifying a value of a tweak data field in the first log block to ensure a CRC field of the first block remains unchanged.

14. The media of claim 11, wherein each log block in the WAL includes, a CRC value of the log block, a CRC value of its next adjacent log block, a tweak data field, and a payload data section.

15. The media of claim 11, wherein copying the contents of the head-block of the log segment into the tail-block of the WAL, further comprises:
 determining a location in a random access memory (RAM) that stores the tail-block of the WAL; and
 replacing the contents of the tail-block of the WAL with the contents of the head-block of the log segment, wherein the location of the tail-block of the WAL in the RAM remains unchanged.

16. A network computer for managing data in a file system, comprising:
 a non-transitory memory device that stores at least instructions; and
 one or more processors that execute the instructions that are configured to cause actions, including:
  generating a write-ahead log (WAL) for preserving a verifiable record of file system activity, wherein the WAL includes a sequence of log blocks that each include a cyclic redundancy check (CRC) value of a next adjacent log block in the WAL and a last log block in the WAL is a tail-block with a placeholder value for a CRC value of its next adjacent log block in the WAL;
  in response to executing a file system operation associated with payload data, performing further actions, including:
   generating one or more log blocks based on the payload data, wherein the one or more log blocks each include a portion of the payload data;
   generating a log segment that includes the one or more log blocks, wherein each log block in the log segment includes a reference to a next adjacent log block in the log segment;
   modifying a portion of the contents of a head-block of the log segment, wherein the modified head-block of the log segment has a CRC value that is modified to match a CRC value of the tail-block of the WAL, wherein the modification prevents one or more CRC errors occurring in the generation of the WAL for the file system activity;
   copying the contents of the modified head-block of the log segment into the tail-block of the WAL; and
   providing an acknowledgment that the file system operation is executed.

17. The network computer of claim 16, wherein modifying the portion of the contents of the head-block of the log segment, further comprises:
 determining a tweak data field in the head-block of the log segment;
 determining a remainder portion of the head-block of the log segment absent the tweak data field;

determining a value for the tweak data field based on a combination of the determined value of the tweak data field in the head-block of the log segment and the remainder portion of the head-block of the log segment, wherein a CRC value for the combination of the determined value of the tweak data field of the head-block of the log segment and the remainder portion of the head-block of the log segment matches the CRC value of the tail-block of the WAL.

18. The network computer of claim 16, wherein the one or more processors execute instructions that perform actions, further comprising:
   determining a sequence of one or more remove log blocks in the WAL that are designated for removal from the WAL based on another file system operation;
   determining a first log block in the WAL that is prior to and adjacent to the sequence of the one or more remove log blocks;
   updating a reference in the first log block to point to a second log block in the WAL that is subsequent to and adjacent to the sequence of the one or more remove log blocks;
   updating a reference to a next log block in the first log block to point to the second log block;
   updating a next log block CRC field in the first log block to match a CRC field in the second log block; and
   modifying a value of a tweak data field in the first log block to ensure a CRC field of the first block remains unchanged.

19. The network computer of claim 16, wherein each log block in the WAL includes, a CRC value of the log block, a CRC value of its next adjacent log block, a tweak data field, and a payload data section.

20. The network computer of claim 16, wherein copying the contents of the head-block of the log segment into the tail-block of the WAL, further comprises:
   determining a location in a random access memory (RAM) that stores the tail-block of the WAL; and
   replacing the contents of the tail-block of the WAL with the contents of the head-block of the log segment, wherein the location of the tail-block of the WAL in the RAM remains unchanged.

\* \* \* \* \*